(12) United States Patent
Du et al.

(10) Patent No.: US 9,490,165 B2
(45) Date of Patent: Nov. 8, 2016

(54) RELIABLE INTERCONNECT INTEGRATION SCHEME

(75) Inventors: Luying Du, Singapore (SG); Fan Zhang, Singapore (SG); Jun Chen, Singapore (SG); Bei Chao Zhang, Shanghai (CN); Juan Boon Tan, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 1079 days.

(21) Appl. No.: 12/982,862

(22) Filed: Dec. 30, 2010

(65) Prior Publication Data

US 2012/0168915 A1 Jul. 5, 2012

(51) Int. Cl.
  *H01L 21/768* (2006.01)
  *H01L 23/522* (2006.01)
  *H01L 23/532* (2006.01)

(52) U.S. Cl.
  CPC ..... *H01L 21/76835* (2013.01); *H01L 21/7682* (2013.01); *H01L 21/76807* (2013.01); *H01L 21/76831* (2013.01); *H01L 23/5222* (2013.01); *H01L 23/53295* (2013.01); *H01L 21/76832* (2013.01); *H01L 21/76834* (2013.01); *H01L 21/76849* (2013.01); *H01L 2924/0002* (2013.01)

(58) Field of Classification Search
  CPC ............ H01L 21/7682; H01L 21/76835; H01L 21/76834; H01L 21/76807; H01L 21/76831; H01L 23/5329; H01L 21/02203; H01L 21/76829; H01L 21/76885; H01L 21/02362; H01L 21/31695; H01L 21/76849; H01L 21/02304; H01L 21/76801; H01L 21/76802; H01L 21/76837; H01L 21/76877
  USPC ....... 438/261, 361, 424, 427, 435, 622, 623, 438/624, 625, 628; 257/E21.29
  See application file for complete search history.

(56) References Cited

U.S. PATENT DOCUMENTS

| | | | |
|---|---|---|---|
| 6,838,355 B1 * | 1/2005 | Stamper et al. | 438/409 |
| 2002/0127844 A1 * | 9/2002 | Grill et al. | 438/622 |
| 2004/0084761 A1 * | 5/2004 | Karthikeyan et al. | 257/700 |
| 2004/0207084 A1 * | 10/2004 | Hedrick et al. | 257/751 |
| 2005/0263896 A1 * | 12/2005 | Lur et al. | 257/758 |
| 2008/0054473 A1 * | 3/2008 | Park | 257/762 |
| 2008/0073748 A1 * | 3/2008 | Bielefeld et al. | 257/522 |
| 2009/0072403 A1 * | 3/2009 | Ito et al. | 257/751 |
| 2010/0270677 A1 * | 10/2010 | Usami | 257/773 |
| 2011/0285028 A1 * | 11/2011 | Seo | 257/774 |

FOREIGN PATENT DOCUMENTS

JP WO 2010/089818 A1 * 8/2010

* cited by examiner

*Primary Examiner* — Davienne Monbleau
*Assistant Examiner* — Leslie Pilar Cruz
(74) *Attorney, Agent, or Firm* — Horizon IP Pte. Ltd.

(57) ABSTRACT

Embodiments relate to a method for forming reliable interconnects by preparing a substrate with a dielectric layer, processing the dielectric layer to serve as an IMD layer, wherein the IMD layer comprises a hybrid IMD layer comprising a plurality of dielectric materials with different k values.

21 Claims, 27 Drawing Sheets

RELIABLE INTERCONNECT INTEGRATION SCHEME

BACKGROUND

The fabrication of integrated circuits (ICs) involves the formation of features on a substrate that make up circuit components, such as transistors, resistors and capacitors. The devices are interconnected, enabling the IC to perform the desired functions. Interconnections are formed by forming contacts and conductive lines in a dielectric layer using, for example, damascene techniques.

As critical dimensions (CD) continue to shrink, RC delay contributed by back-end-of line (BEOL) interconnects becomes more and more significant. In the effort to introduce lower k dielectrics for BEOL interconnects, materials such as porous ultra low k (ULK) inter level dielectric (ILD) and lower k SiCN Copper (Cu) barrier material have been proposed. However, with the continuous decrease of k value, the dielectrics become structurally more porous with lower mechanical strength and fracture toughness. In addition, integration of Cu with ULK dielectrics in BEOL has issues such as difficulty in handling damage of ULK post RIE/ashing, cleaning, Cu Chemical Mechanical Polishing (CMP), or packaging.

From the foregoing discussion, it is desirable to provide a ULK integration scheme that is more robust and reliable.

SUMMARY

Embodiments relate to a method for forming reliable interconnects. The method comprises forming a device by preparing a substrate with a dielectric layer, processing the dielectric layer to serve as an intermetal dielectric (IMD) layer, wherein the IMD layer comprises a hybrid IMD layer comprising a plurality of dielectric materials with different k values.

In one embodiment, the hybrid IMD layer comprises a first dielectric material with a first k value and a second dielectric material with a second k value. In another embodiment, the hybrid IMD layer comprises a first dielectric material with a first k value, a second dielectric material with a second k value, and a third dielectric material with a third k value. In yet other embodiments, the hybrid IMD layer may comprise other number of dielectric materials with different k values.

These and other objects, along with advantages and features of the present invention herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIGS. 4a-m show an alternative embodiment of a process of forming a device.

DETAILED DESCRIPTION

Embodiments generally relate to devices, such as semiconductor devices or ICs. Other types of devices, such as micro electro-mechanical systems (MEMS), liquid crystal displays, are also useful. The devices can be any type of IC, for example, dynamic or static random access memories, signal processors or system-on-chip devices. The devices can be incorporated into, for example, consumer electronic products, such as computers, cell phones, and personal digital assistants (PDAs).

Figure 1:
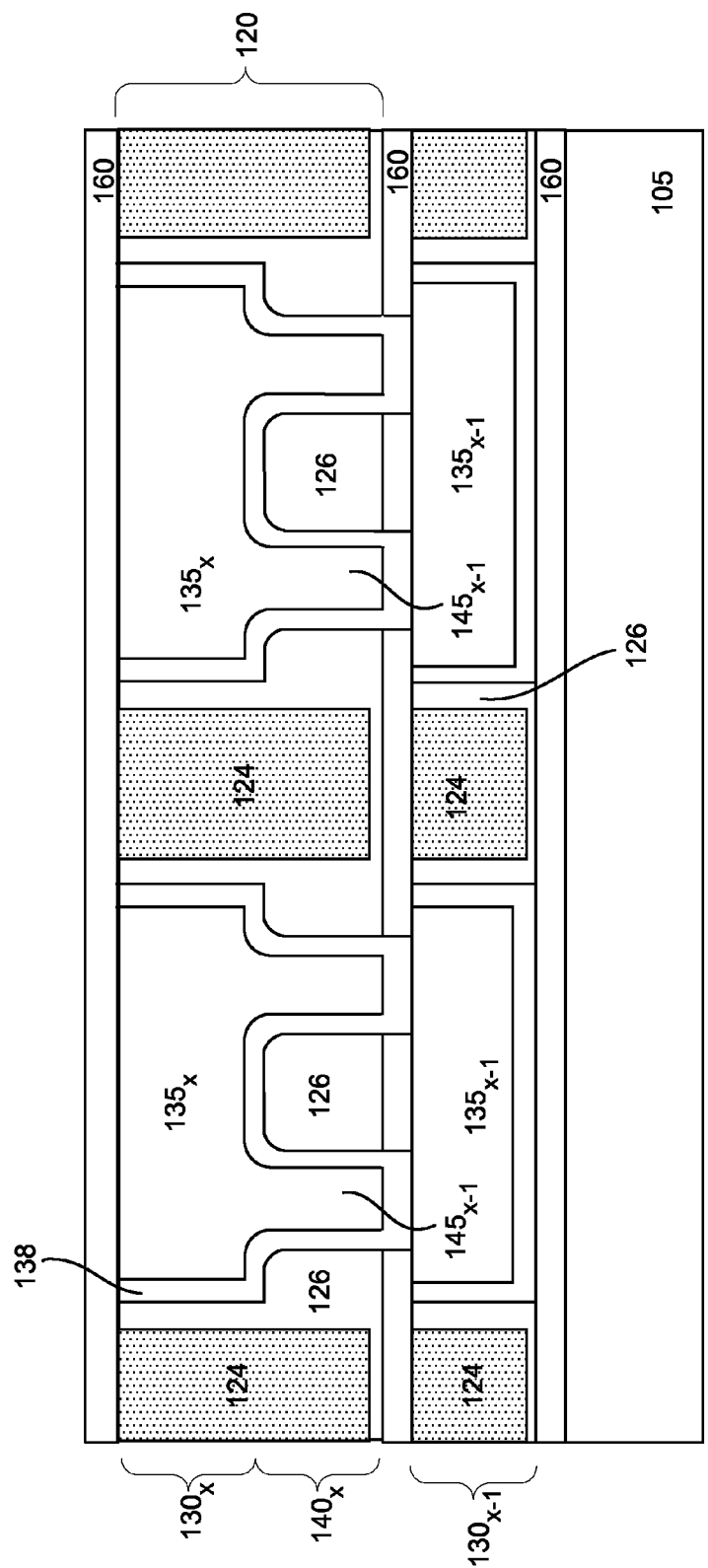
FIG. 1 shows an embodiment of a device layer.
Figure 2A:
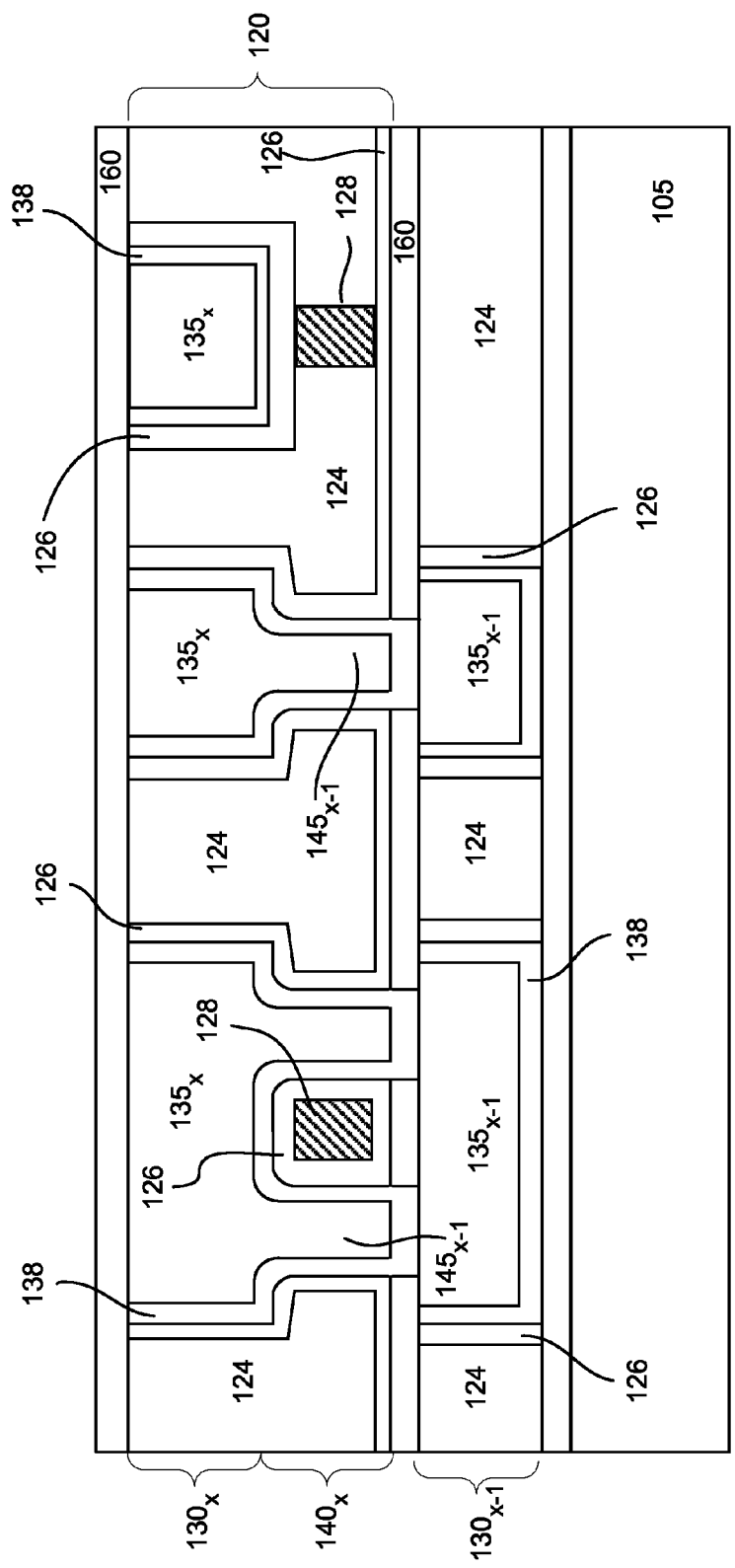
FIGS. 2a-b show alternative embodiments of a device layer.
Figure 2B:
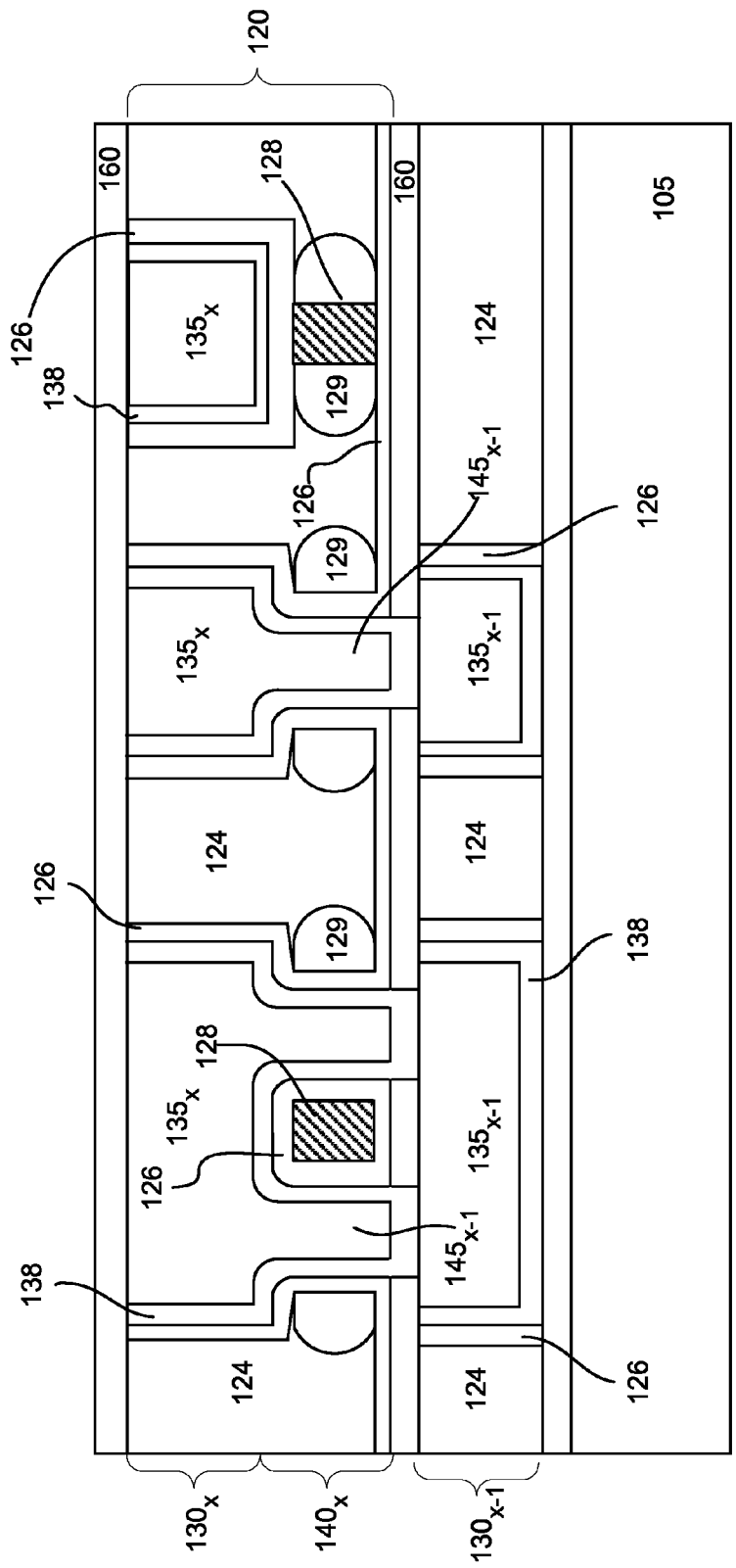

FIG. 1 and FIGS. 2a-b show cross-sectional views of various embodiments of a device 100. Referring to the Figs., a portion of a device, such as an integrated circuit (IC) is shown. Other types of devices may also be employed. The portion of the device includes a substrate 105. The substrate, for example, comprises a silicon substrate. Other types of substrates, such as silicon germanium or silicon-on-insulator (SOI), are also useful. The substrate may include circuit components (not shown) such as transistors, capacitors, or resistors formed thereon. Other types of circuit components are also useful.

On the substrate are provided interconnects to electrically couple the circuit components as desired to form the device. The interconnects are generally provided in a plurality of interconnect levels 120, wherein 1 is the lowest interconnect level and n is the highest interconnect level.

Interconnects are formed in an intermetal dielectric (IMD) layer 120. An IMD layer includes a trench level $130_x$ in an upper portion which corresponds to the metal level ($M_x$). For example, interconnects or metal lines $135_x$ are disposed in the trench level $130_x$ of the IMD layer. A lower portion of the IMD layer includes a via level $140_{x-1}$ having contacts $145_{x-1}$.

The contacts couple the interconnects $135_x$ to contact areas below. Depending on the interconnect level, the contact regions can be, for example, other interconnects $135_{x-1}$ of a trench level $130_{x-1}$ of a lower IMD layer. For example, in the case where x is ≥2 (M2 or above), the contact areas comprise interconnects $135_{x-1}$. In some cases, the contact area may comprise active device regions, such as diffusion regions of transistors, transistor gates, capacitor plates or other types of regions or a combination thereof. For example, in the case where x=1 (M1), the contacts are in a premetal dielectric (PMD) level and the contact areas comprise active device regions. It is understood that the different IMD levels need not be the same. For example, different materials or construction may be employed for different IMD levels. In some embodiments, the upper IMD levels are the same while the lowest IMD level is different. Other configurations of IMD levels are also useful.

The conductive lines and contacts comprise a conductive material. The conductive material may be any metal or alloy. For example, the conductive material may comprise copper, aluminum, tungsten, their alloys, or a combination thereof. Other conductive materials may also be useful. The interconnects and contacts may comprise the same material. In some embodiments, the interconnects and contacts may comprise different materials. For example, the contacts may comprise tungsten while the interconnects may comprise copper. Such a configuration may be useful for premetal and M1 levels. In other embodiments, both the conductive lines and contacts/vias may comprise of copper.

The conductive line and/or contact may be provided with vertical or substantially vertical sidewalls. Alternatively, the conductive lines and/or contacts are provided with slanted sidewalls. The slanted sidewall profile can improve sidewall barrier and seed coverage during processing. The slanted sidewalls, for example, comprise an angle of about 85-89°.

As shown in FIG. 1, the interconnects of the IMD layer may comprise wide interconnects with, for example, dual contacts. In a dual contact configuration, first and second contacts are disposed adjacent to each other. In other embodiments, the interconnects of the IMD layer may comprise narrow interconnects with single contacts. In a single contact configuration, a single contact is provided to couple an interconnect to a lower contact area. Alternatively, as shown in FIGS. 2a-b, the IMD layer may include a combination of wide interconnects with dual contacts and narrow interconnects with single contacts. Other configurations of interconnects and contacts may also be provided for the IMD layer.

A barrier layer 138 can be provided to line the trench and/or via sidewalls and bottoms. The barrier serves to protect, for example, the conductive material from diffusing into the IMD layer. The barrier, for example, can comprise a conductive material such as tantalum nitride (TaN), tantalum (Ta), titanium nitride (TiN) or a combination thereof. Other type of barrier material, such as ruthenium, is also useful. In other embodiments, the barrier layer may comprise non-conductive materials. In such applications, the barrier layer does not line the bottom of the via, enabling electrical coupling between the contact and contact region below.

The surface of the interconnects can comprise a capping layer (not shown), which may be removed after processing. In one embodiment, the protective capping layer comprises a conductive capping layer. The conductive capping layer, for example, comprises CoWP. Other types of conductive capping layers are also useful. The thickness of the capping layer may be about 10-1000 Å. Providing a capping layer with other thicknesses is also useful. The capping layer can serve to passivate the metal line. Alternatively, the capping layer serves to protect the metal lines during subsequent lithographic processes.

An etch stop layer 160 may be provided over the IMD layer. The etch stop layer, for example, is disposed on the surface of IMD layer and interconnects. The etch stop layer comprises a dielectric material such as silicon carbide. Other types of etch stop materials, such as SiN, can also be useful. The etch stop layer may also serve as a capping layer of the IMD layer. Other types of etch stop layers are also useful. The thickness of the etch stop layer may be about 250-1500 Å. Other thicknesses are also useful. In some cases, an etch stop layer can also be disposed between the trench and via levels. Alternatively, for lower k processes, the etch stop layer may be omitted to further reduce the k value.

The IMD layer, in one embodiment, comprises a hybrid IMD layer. The hybrid IMD layer comprises a plurality of y dielectric materials with different k values, where y≥2. In one embodiment, the hybrid IMD layer comprises first and second dielectric materials with different k values (e.g., y=2). Alternatively, the hybrid IMD layer comprises first, second and third dielectric materials with different k values (e.g., y=3) or first, second, third and fourth dielectric materials or media (e.g., y=4). In yet other embodiments, the hybrid IMD layer may comprise other number of dielectric materials with different k values.

Lower k value materials are porous and lack mechanical strength to withstand processing. In one embodiment, higher k materials of the hybrid IMD layer are configured to serve as support structures or to provide mechanical support while lower k materials serve to decrease the overall k value of the hybrid IMD layer. This produces a hybrid IMD layer having a low k value with increased mechanical strength as compared to an IMD layer of a single dielectric material. This increases performance and reliability of the device.

In one embodiment, as shown in FIG. 1, the hybrid IMD layer comprises a first dielectric material 124 with a first k value and a second dielectric material 126 with a second k value. One of the first and second dielectric materials comprises a k value which is higher than the other of the dielectric material. For example, one of the first and second dielectric materials comprises a low-k (LK) dielectric material and the other of the first and second dielectric materials comprises an ultra low-k (ULK) dielectric material, wherein the k of the LK material is higher than the k of the ULK material. The LK and ULK materials can include, for example, SiOCH and pSiCOH, respectively.

In one embodiment, the first dielectric material 124 comprises a lower k than the second dielectric material. The second dielectric material with the higher k is disposed adjacent to trenches or interconnnects. For example, the second dielectric material is disposed on the sides and below the interconnects in the IMD layer. Where multiple contacts are provided below an interconnect, the second dielectric material may be disposed between the contacts of the interconnects. In one embodiment, the first dielectric material 124 is disposed between the second dielectric materials 126 of adjacent interconnects. For example, the second dielectric material surrounds sides and a bottom of the first dielectric material. Other configurations of the first and second dielectric materials to increase mechanical stability of the IMD layer while achieving a desired low k value are also useful. In one embodiment, the width of the LK is preferably about 20 nm (or 2/7 the width of the trench) while the width of the ULK is preferably about 50 nm (or 5/7 the width of the trench).

In an alternative embodiment, a hard mask material may be disposed in an upper portion of the second dielectric material adjacent to upper portions of the trenches. The hard mask material may serve as a third dielectric material with a third k value different from that of the first and second dielectric materials. The hard mask material, for example, may comprise TEOS. Other types of hard mask materials may also be useful. Alternatively, the hard mask may have the same k value as the second dielectric material and serve as an extra layer of the second dielectric material.

Referring to FIG. 2a, the hybrid IMD layer 120 comprises a first dielectric material 124 with a first k value, a second dielectric material 126 with a second k value and a third dielectric material 128 with a third k value. The k values of the different dielectric materials are different. In one embodiment, the first dielectric material comprises the lowest k value, the second dielectric material comprises an intermediate k value and the third dielectric material comprises the highest k value. In one embodiment, the first dielectric material comprises a ULK material, the second dielectric material comprises a LK material and the third dielectric material comprises a normal K (NK) material. The LK and ULK materials can include SiOCH and pSiCOH, respectively; while the NK materials may include silicon oxide ($SiO_2$) or FSG. Other types of ULK, LK and NK materials are also useful.

In one embodiment, the second dielectric material having the intermediate k value lines the trench opening in sidewalls and bottom of trenches in the trench level and sidewalls of vias in the via level. The second dielectric material also lines a bottom of the IMD layer. The third dielectric material with the highest k value is disposed below the trenches between the second dielectric material lining the bottom of the trenches and the bottom of the IMD layer. In one embodiment, the width of the third dielectric material is less than the width of the trenches. For example, the NK third dielectric material may be 60 nm less than the width of the trench, i.e., one seventh ($1/7$) the width of the trench.

The third dielectric material is deposited on the wafer first before the trench structure is formed by lithographic or etch processes. This is followed by deposition of the second dielectric material, after which, vias are formed using lithographic or etch processes to form a dual damascene structure. In an alternative embodiment, a second layer of the second dielectric material may be deposited to form a hard mask to enable the via bottoms to be opened to form the conductive metal and line. CoWP may then be deposited to protect the first layer of the second dielectric layer as well as the conductive metal and line, to enable dry and wet etch of the third dielectric material. The first dielectric material may then be deposited.

FIG. 2b shows another embodiment of an IMD layer 120. The IMD layer is similar to that shown in FIG. 2a, except that it comprises a fourth material or medium 129 having a different k value than the other materials. In one embodiment, the fourth material comprises the lowest k value of the materials of the IMD layer, Hence, the k value of the fourth material is the lowest among the first, second and third dielectric materials. In one embodiment, the fourth material comprises air. As shown, the fourth material is disposed adjacent to the third material 128 below the trenches or adjacent to the second material 126 lining the exposed sides of the vias. This can reduce the capacitance between the parallel copper lines to reduce RC delay and improve circuit performance.

Figure 3A:
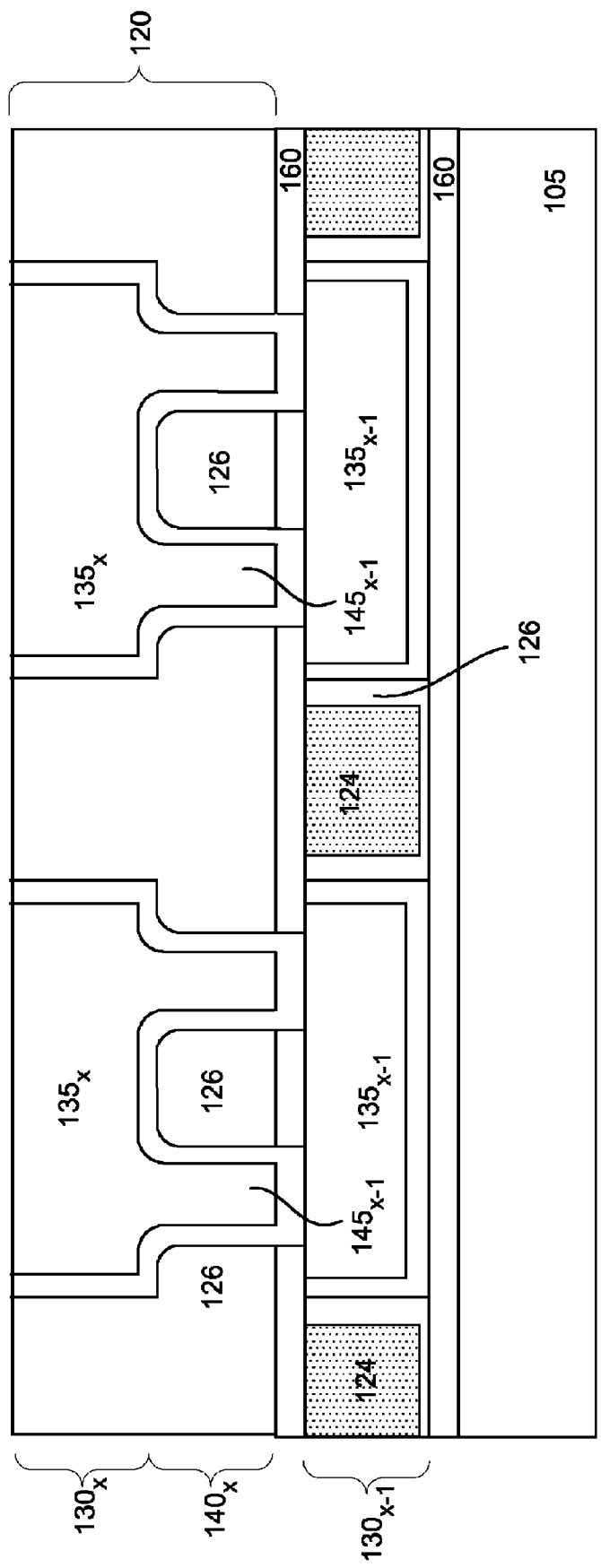
FIGS. 3a-h show an embodiment of a process of forming a device.

FIGS. 3a-h show a process for forming a portion 100 of a device, such as an IC in accordance with one embodiment. Referring to FIG. 3a, a substrate 105 is provided. The substrate, for example, comprises a p-type silicon substrate. Other types of substrates, such as a germanium-based, gallium arsenide, silicon-on-insulator (SOI), or sapphire substrate, are also useful. The substrate can be prepared with circuit components (not shown). Circuit components can include, for example, transistors, capacitors and/or resistors. Other types of circuit components are also useful.

The substrate is further prepared with a dielectric layer. The dielectric layer, for example, is partially processed and will serve as a hybrid IMD layer 120. In one embodiment, the partially processed dielectric layer comprises a second material 126. The second material, for example comprises a higher k value than a first dielectric material 124 of a hybrid IMD layer. In one embodiment, the second material comprises a LK dielectric material, such as SiOCH. The LK dielectric material can be formed by various techniques, such as spin-on or chemical vapor deposition (CVD). Other techniques may also be useful to form the dielectric layer.

The dielectric layer is processed to include a trench level 130$_x$ in an upper portion which corresponds to a metal level (M$_x$). A lower portion of the IMD layer includes a via level 140$_{x-1}$. Trenches are provided in the trench level and vias are provided in the via level. Interconnects 135$_x$ are formed in the trenches and contacts 145$_{x-1}$ are formed in the vias of IMD layer 120. Various techniques can be used to form the trenches and vias.

In one embodiment, the trenches and vias are formed by dual damascene techniques. For example, via first or trench first dual damascene techniques may be employed. Other dual damascene techniques may also be useful. Dual damascene processes produce contacts and interconnects of the same material.

In a via first dual damascene technique, a mask is provided on the surface of the dielectric layer and patterned to form openings corresponding to locations of the vias. The mask may be a soft mask, such as a photoresist mask or a combination of a soft mask with a hard mask, such as TEOS or silicon nitride below. Other mask configurations or materials are also useful.

The dielectric layer is patterned to remove portions exposed by the mask to form vias. Patterning of the dielectric layer, for example, comprises an anisotropic etch, such as reactive ion etching (RIE). Other techniques for patterning the dielectric layer are also useful. The vias expose a contact region below.

A lower etch stop layer 160, such as SiC, may be disposed below the dielectric layer. Other materials, such as SiN, may be used for the lower etch stop layer. The etch to form the vias removes portions of the lower etch stop layer to expose the contact region. For example, the lower etch stop layer may be a capping layer of a lower hybrid IMD layer with interconnects 135$_{x-1}$. This will generally be the case for x≥2. In the case where x=1, the contact region may comprise active device regions. The interconnect level 130$_{x-1}$ of the lower hybrid IMD layer, for example, comprises first and second dielectric materials 124 and 126 with different k values. The first dielectric layer, for example, comprises a ULK material while the second dielectric material comprises a LK material. Other types of hybrid IMD layers may also be useful.

After forming the vias, the soft mask is removed. The soft mask is removed by, for example, ashing. Other techniques for removing the soft mask are also useful. A trench soft mask is formed over the dielectric layer with openings corresponding to trenches. The dielectric layer is patterned to remove portions exposed by the mask to form trenches in an upper portion or trench level. The trench mask is removed after forming the dual damascene openings with trenches in the trench level and vias in the via level. The trench and vias may also be formed by, for example, trench first dual damascene techniques.

An intermediate etch stop layer may be provided between the trench and via levels. This, for example, may be similar to the etch stop layer 160 disposed below the interconnect level 130$_{x-1}$ of the lower IMD layer. The intermediate etch stop layer, for example, comprises SiC. Other types of etch stop material may also be useful. The intermediate etch stop layer may be employed to differentiate the trench and via levels. For example, the intermediate etch stop layer may facilitate forming the trenches and vias. In other embodiments, the intermediate etch stop layer may be omitted to further reduce the k value.

As shown, the dual damascene opening comprises vertical sidewalls. Providing openings with slanted sidewalls may also be useful. For example, the sidewalls can have an angle of about 85-89°. Other sidewall angles may also be useful.

In one embodiment, a barrier layer 138 is deposited on the substrate, lining the surface of the dielectric layer and the openings. For applications with a hard mask, the barrier layer lines the surface of the hard mask and the openings.

The barrier layer, for example, can comprise TaN, Ta, TiN or a combination thereof. Other type of barrier material, such as ruthenium, is also useful. Providing a barrier layer having multiple layers is also useful. The barrier can be formed by, for example, physical vapor deposition (PVD), CVD or atomic layer deposition (ALD). Other techniques for forming the barrier are also useful.

A conductive material is deposited or formed on the substrate, covering the barrier and filling the trenches and vias. The conductive material, for example, comprises copper, aluminum, tungsten, alloys such as Al doped Cu, Mn doped Cu, or a combination thereof. Other types of conductive materials, including metals and alloys, are also useful. In one embodiment, the conductive material comprises copper. The conductive material may be deposited by electro-plating. Other techniques, such as electro-less plating, CVD, PVD or sputtering, are also useful. The technique employed may depend on the material used. Excess conductive material is removed to form interconnects.

In one embodiment, the excess material is removed by a planarizing process. The planarizing process removes excess conductive material and the liner layer on the surface of the second dielectric material layer. This results in the top surface of the conductive material being planar with the top surface of the second dielectric material. The planarizing process comprises, for example, a polishing process, such as chemical mechanical polishing (CMP), electro-CMP (eCMP) or a combination thereof. Other types of planarizing or polishing processes are also useful. The polishing process may include multiple polishing steps to remove the different materials, such as the conductive and barrier materials.

In applications which employ a hard mask, the planarizing process may also remove the hard mask from the surface of the dielectric layer, leaving interconnects having a planar surface with the first dielectric material, as shown. In alternative embodiments, a dielectric hard mask may be employed to achieve the same result.

In yet other embodiments, a single damascene process may be employed to form the trenches and vias of the IMD layer. In single damascene processes, the contacts are formed separately from the interconnects. For example, the via level of the dielectric layer is formed and patterned to form vias. The vias are filled with a conductive material. A barrier may be provided to line the surface of the dielectric layer and vias prior to filling with the conductive material. Excess conductive material is removed by a planarizing process to form contacts in the vias.

Subsequently, a trench level of the dielectric layer is formed over the via level. The trench level is patterned to form trenches. In some embodiments, an etch stop layer may be provided between the via and trench levels. The trenches are filled with a conductive material. A barrier may be provided to line the surface of the dielectric layer and trenches prior to filling with the conductive material. Excess conductive material is removed by a planarizing process to form interconnects in the trenches.

When single damascene processes are used, the interconnects and contacts may be formed using different materials. For example, the contact may comprise tungsten while the interconnects may comprise copper. Forming contact plugs comprising tungsten may be employed, for example, in the PMD level. Other material configurations for contacts and interconnects may also be useful. In other embodiments, the contacts and interconnects may comprise the same material.

Figure 3B:
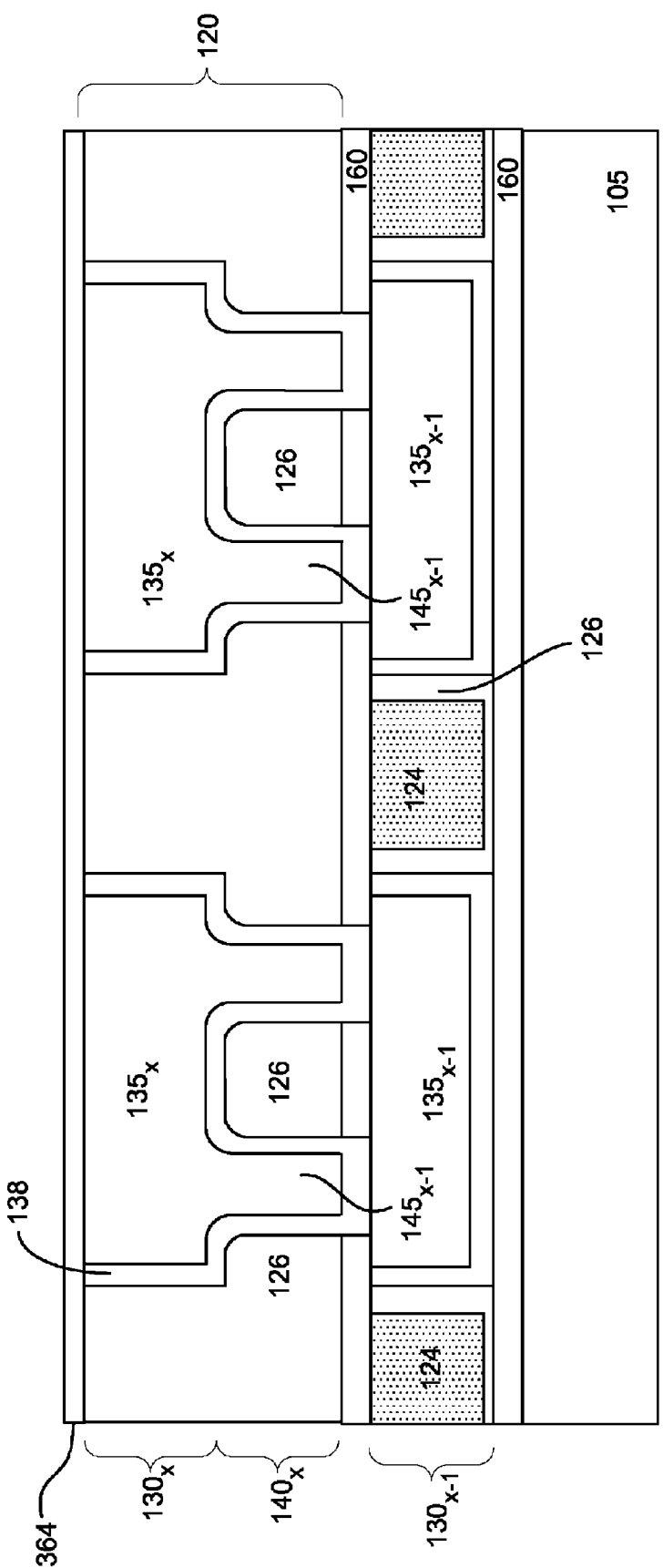

Referring to FIG. 3b, a passivation layer 364 is deposited on the substrate in accordance with one embodiment. The passivation layer covers the dielectric layer and surface of the interconnects. In one embodiment, the passivation layer comprises a material for protection of the conductive material of the interconnects during subsequent lithographic processes. For example, the passivation layer comprises CoWP or CuSiN. Other types of passivation layers are also useful. The passivation layer may be deposited by, for example, CVD. Other techniques for depositing the passivation layer are also useful.

Figure 3C:
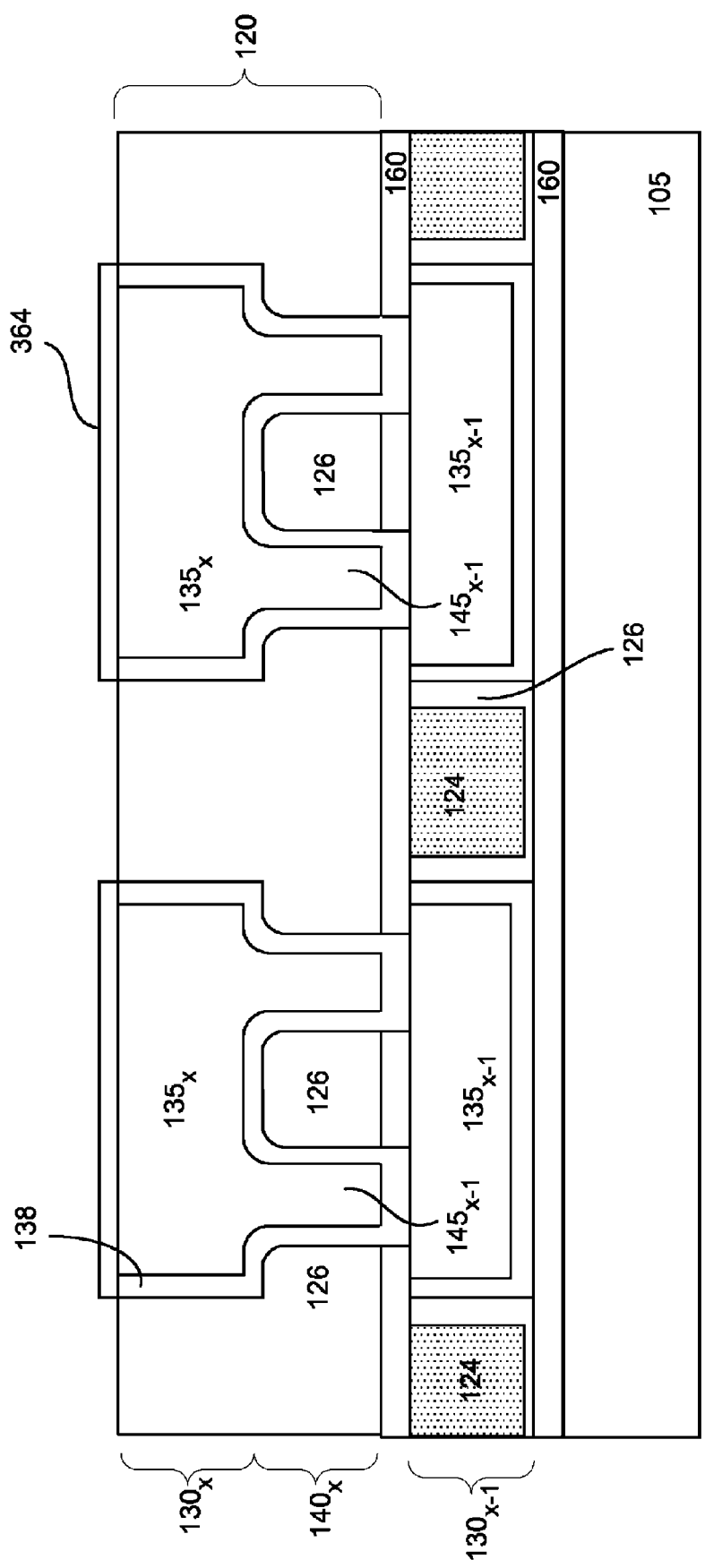

As shown in FIG. 3c, the passivation layer is patterned to selectively cover the interconnects. As shown, the passivation layer is patterned to selectively cover the interconnects and barrier layer. To pattern the passivation layer, mask and etch techniques can be employed. For example, a soft mask, such as a photoresist, can be used. The photoresist, for example, can be formed by various techniques, such as spin-on. Other techniques are also useful. An anti-reflective coating (ARC) can be formed beneath the mask layer.

The mask layer is selectively exposed and developed to create the desired pattern. In one embodiment, the mask comprises a pattern which protects the interconnects and barrier layer. Exposed portions of the passivation layer are removed by, for example, an anisotropic etch, such as RIE. Other techniques for patterning the dielectric are also useful. After the passivation layer is patterned, the mask is removed, leaving portions of the passivation layer covering the interconnects and barrier layer. In other embodiments, the passivation layer may be patterned together with the second dielectric layer.

Figure 3D:
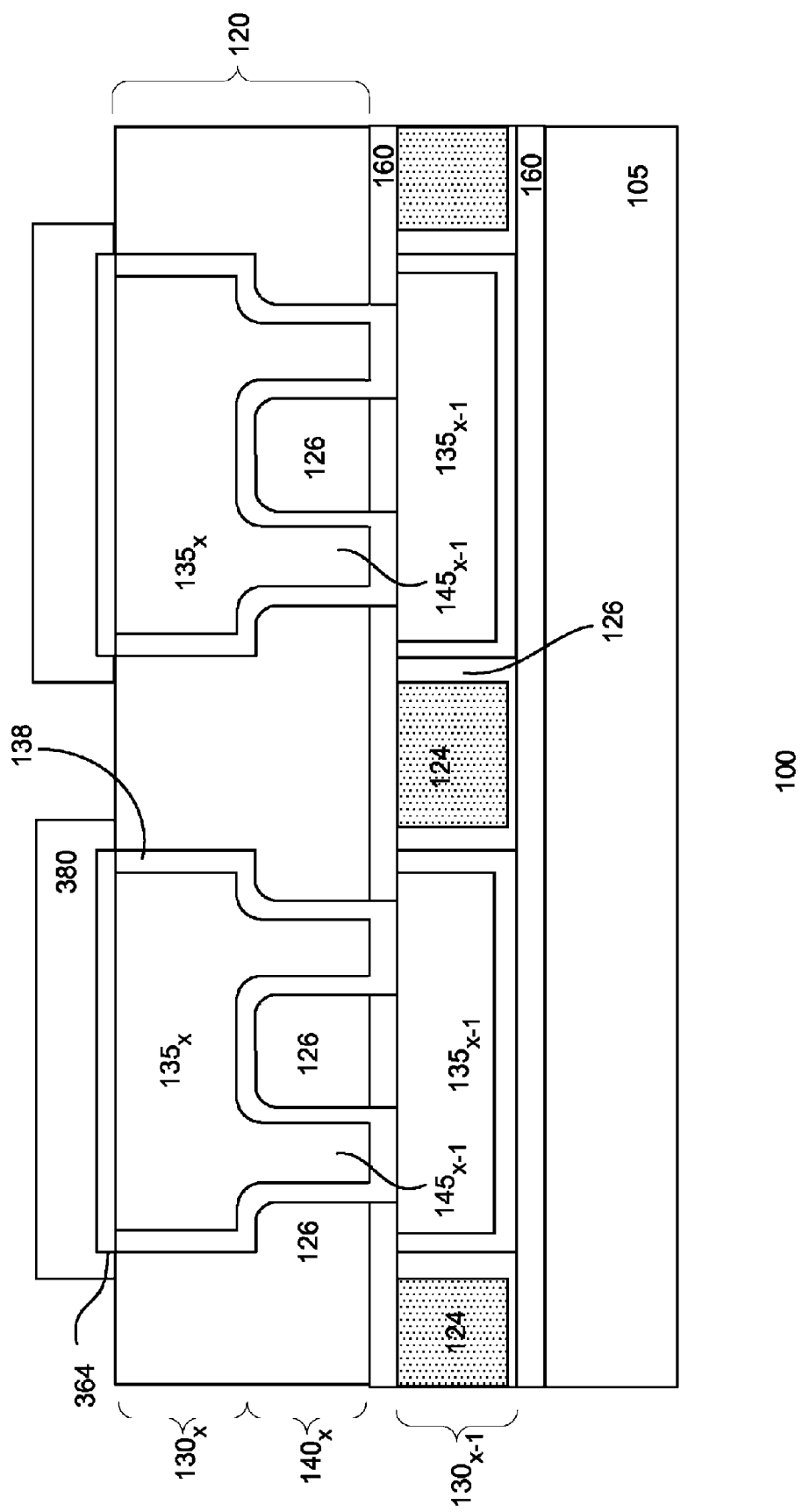

In FIG. 3d, a soft mask layer 380 is formed and patterned. The patterned soft mask layer, in one embodiment, comprises a reverse mask for the non-interconnect area. In one embodiment, the reverse mask also covers about 20 nm of the non-interconnect area, leaving about 50 nm of the non-interconnect area exposed. As a result, the soft mask layer covers the interconnects as well as a small portion of the dielectric layer adjacent thereto.

Figure 3E:
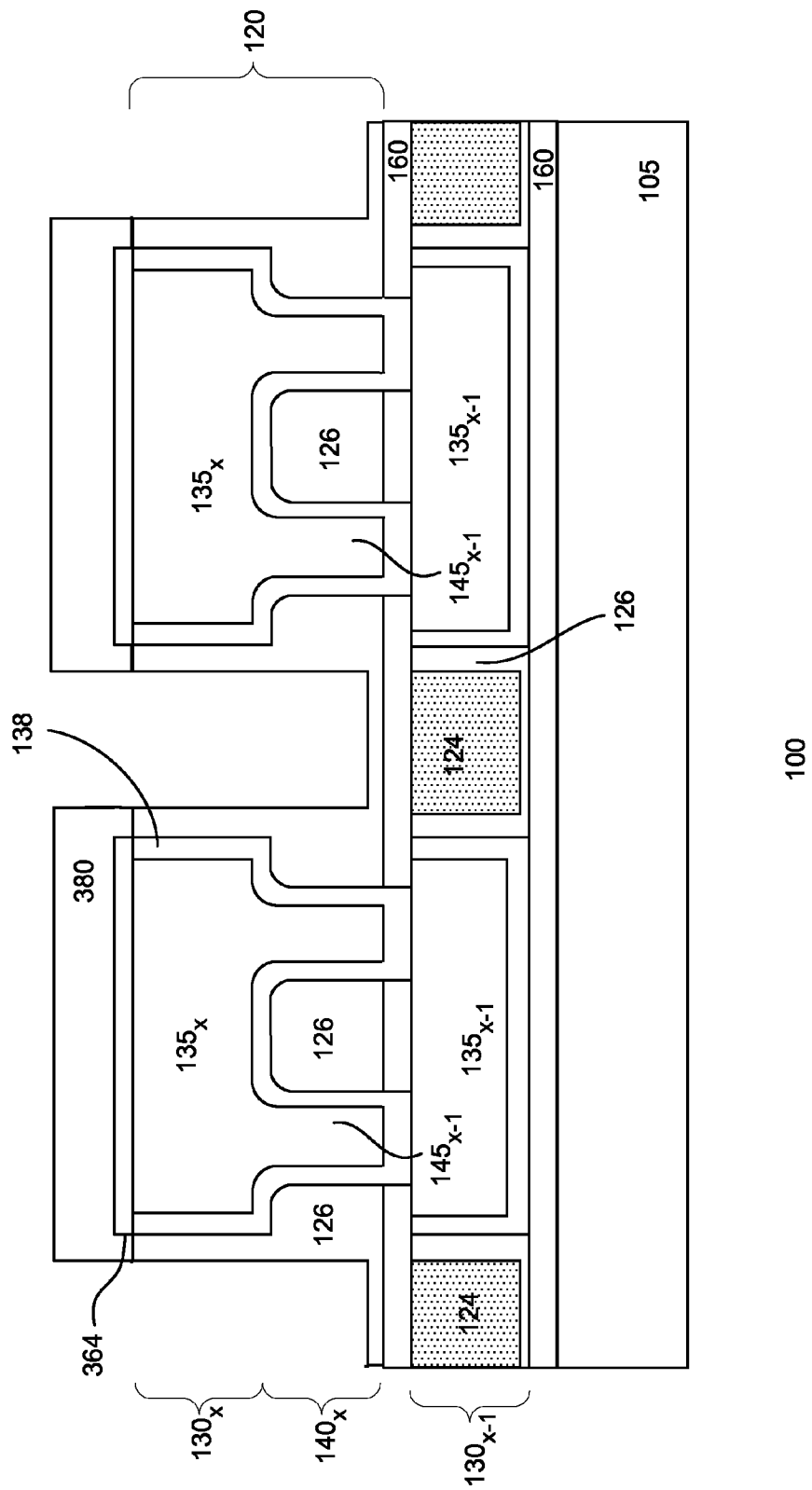

Referring to FIG. 3e, the exposed portions of the second dielectric material is etched. In one embodiment, the dielectric layer is etched to about the level of etch stop layer 160. The soft mask layer is removed after etching of the dielectric layer.

Figure 3F:
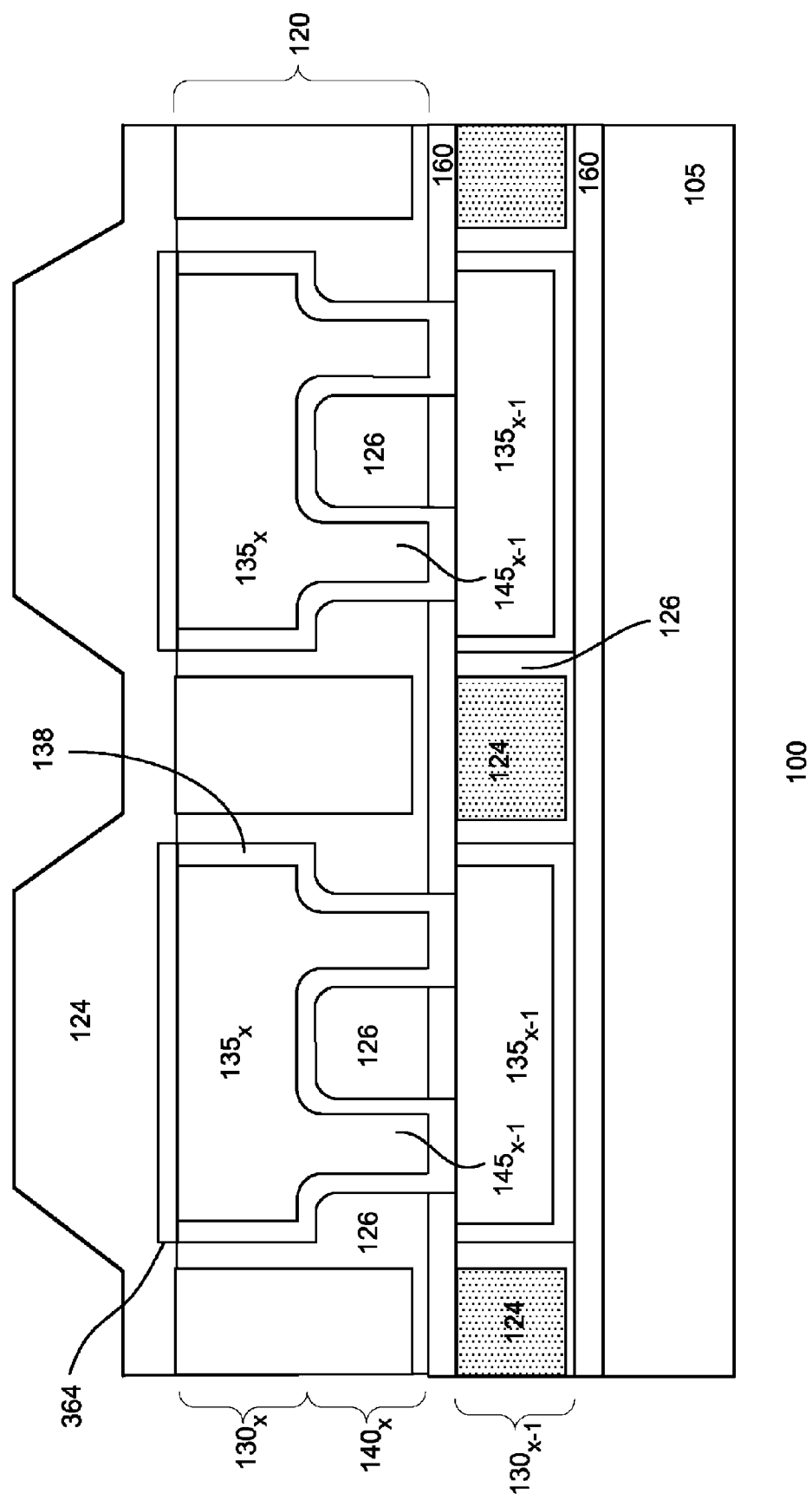

In FIG. 3f, a first dielectric material 124 having a first k value is deposited on the substrate, filling openings in the first dielectric material. In one embodiment, the first k value is less than the second k value. In one embodiment, the first dielectric material comprises a ULK material. For example, the first dielectric material comprises pSiCOH. Various techniques, such as CVD or spin-on can be used to deposit the ULK material.

Figure 3G:
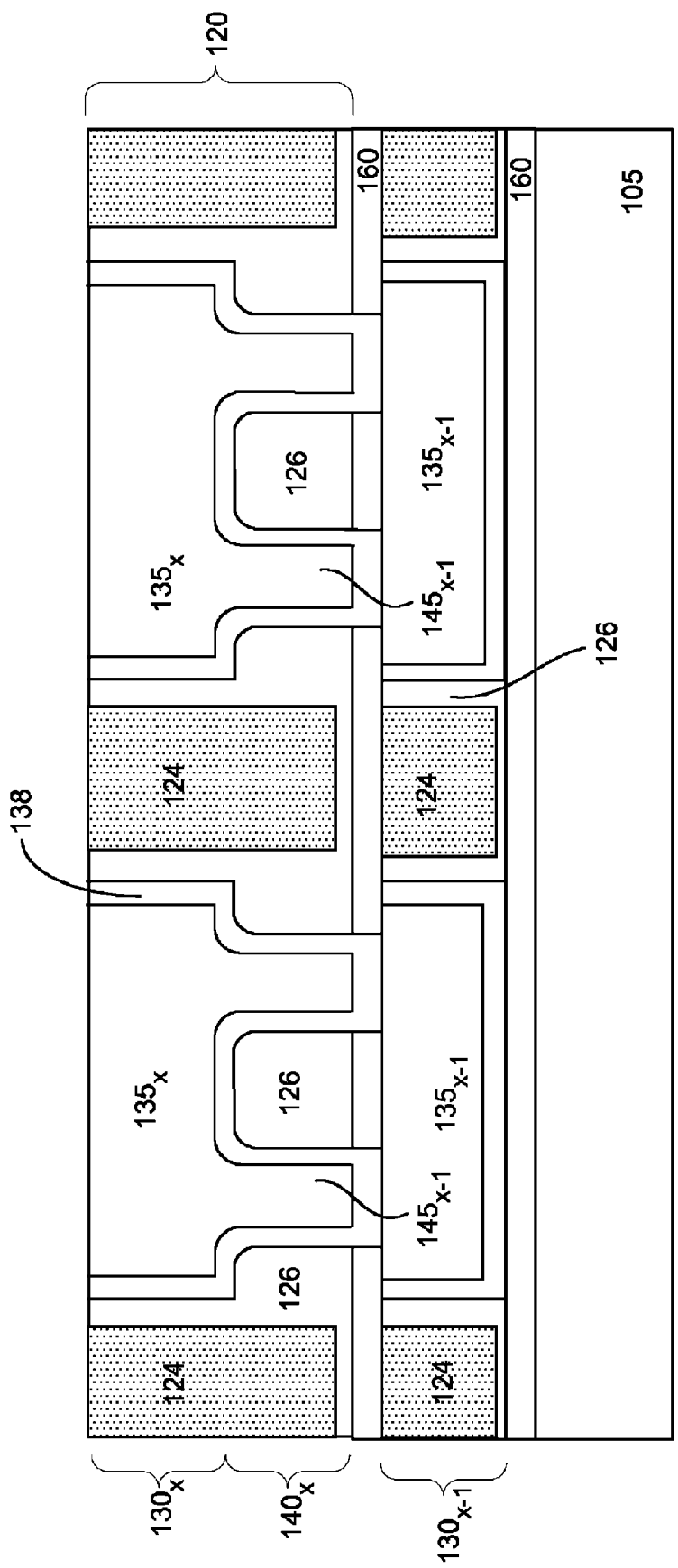

Excess first dielectric material is removed by a planarizing process, as shown in FIG. 3g. The planarizing process, for example, comprises CMP or eCMP. In one embodiment, the planarizing process also removes the passivation layer over the interconnects, resulting in a hybrid IMD layer with top surfaces of the first dielectric material, the second dielectric material and the interconnects being coplanar.

In an alternative embodiment, a hard mask is employed and remains over the second dielectric material. In such embodiments, remnants of the hard mask remains in the hybrid IMD layer above the second dielectric material adjacent to the trenches. For example, the first material, hard mask material and interconnects have top surfaces which are coplanar and form the top surface of the IMD layer. This may result in a hybrid IMD layer with first, second and third hard mask materials all having different k values.

Figure 3H:
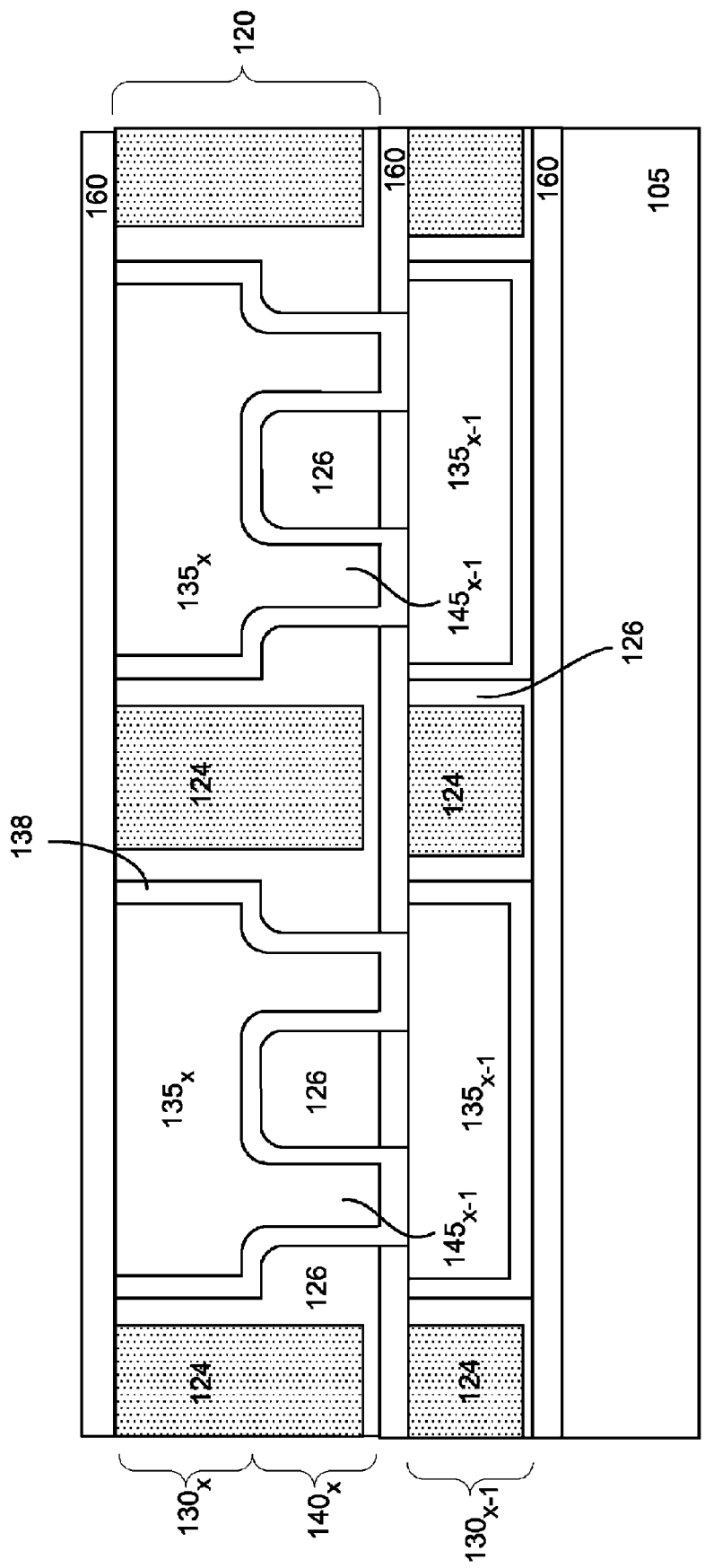

Referring to FIG. 3h, an etch stop layer 160 is formed on the surface of the hybrid IMD layer. The etch stop layer, for example, may serve as a capping layer of the IMD layer. In one embodiment, the etch stop layer comprises SiC. Other types of etch stop layer can also be formed on the top surface of the IMD layer. The etch stop layer, for example, can be formed by CVD or other deposition techniques.

The process continues to form the IC. For example, additional interconnect levels can be formed. The interconnect levels can be formed similar to the process described in FIGS. 3a-h. Further processing can include final passivation, dicing, assembly and packaging. Other processes are also useful.

Figure 4A:
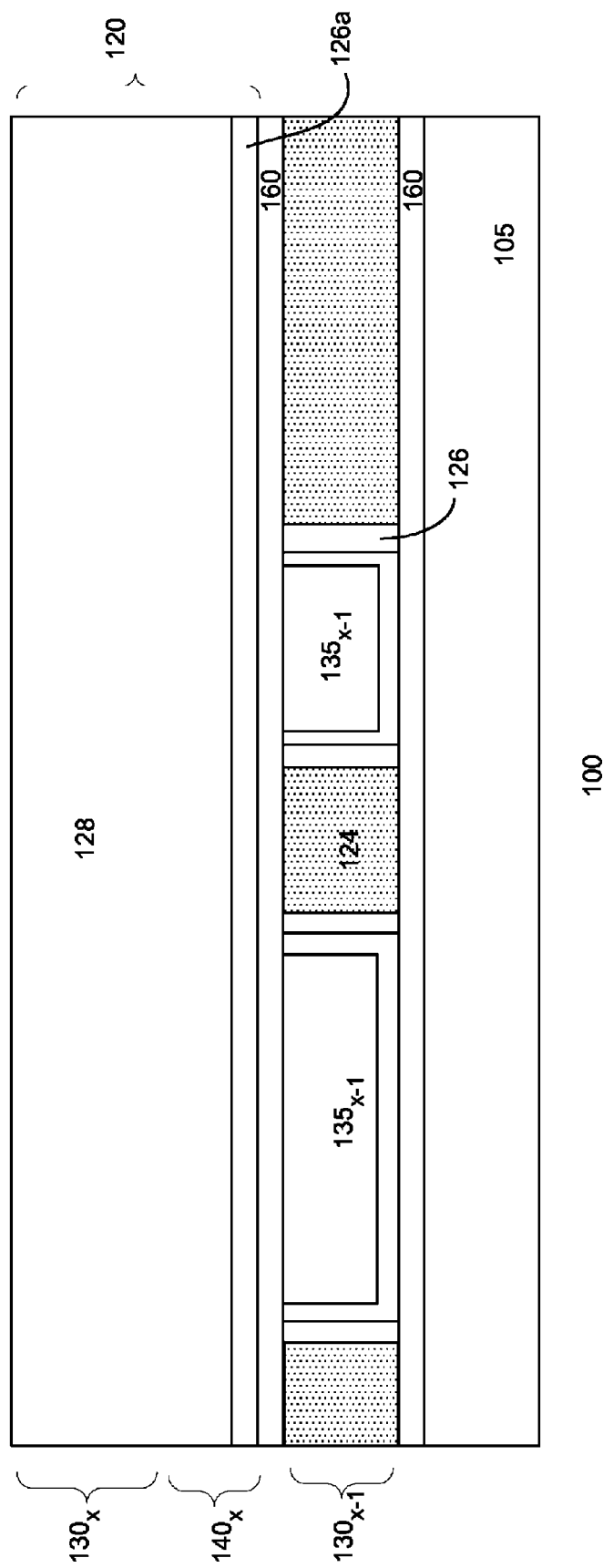

FIGS. 4a-m show a process for forming a portion 100 of a device, such as an IC in accordance with one embodiment. Referring to FIG. 4a, a substrate 105 is provided. The substrate, for example, comprises a p-type silicon substrate. Other types of substrates, such as a germanium-based, gallium arsenide, silicon-on-insulator (SOI), or sapphire substrate, are also useful. The substrate can be prepared with circuit components (not shown). Circuit components can include, for example, transistors, capacitors and/or resistors. Other types of circuit components are also useful.

The substrate is further prepared with a partially processed hybrid IMD layer 120. The partially processed hybrid IMD layer comprises a second dielectric material lining a surface of the substrate. In one embodiment, a lower etch stop layer 160, such as SiC, may be disposed below the partially processed hybrid IMD layer. Other materials, such as SiN, may be used for the lower etch stop layer. The lower etch stop layer, for example, may be a capping layer of a lower interconnect level $130_{x-1}$ with interconnects $135_{x-1}$ of a lower hybrid IMD layer. This will generally be the case for x≥2. In the case where x=1, the contact region may comprise active device regions.

The lower hybrid IMD layer, for example, comprises first and second dielectric materials 124 and 126 with different k values. The first dielectric material, for example, comprises a ULK material while the second dielectric material comprises a LK material. Other types of hybrid IMD layers are also useful. The lower interconnect level may be similar or the same as the IMD layer 120.

The partially processed IMD layer, in one embodiment, comprises a second dielectric material 126a lining the surface of the lower etch stop layer. A third dielectric material 128 is formed over the second dielectric material. The second material, for example, comprises a lower k value than the third dielectric material of a hybrid IMD layer. In one embodiment, the second material comprises a LK dielectric material, such as SiOCH. The LK dielectric material can be formed by various techniques, such as spin-on or chemical vapor deposition (CVD). Other techniques may also be useful to form the dielectric layer. The third dielectric material, in one embodiment, comprises silicon oxide. The third dielectric material may be formed by CVD. Other materials or forming techniques may also be used for the third dielectric material.

Figure 4B:
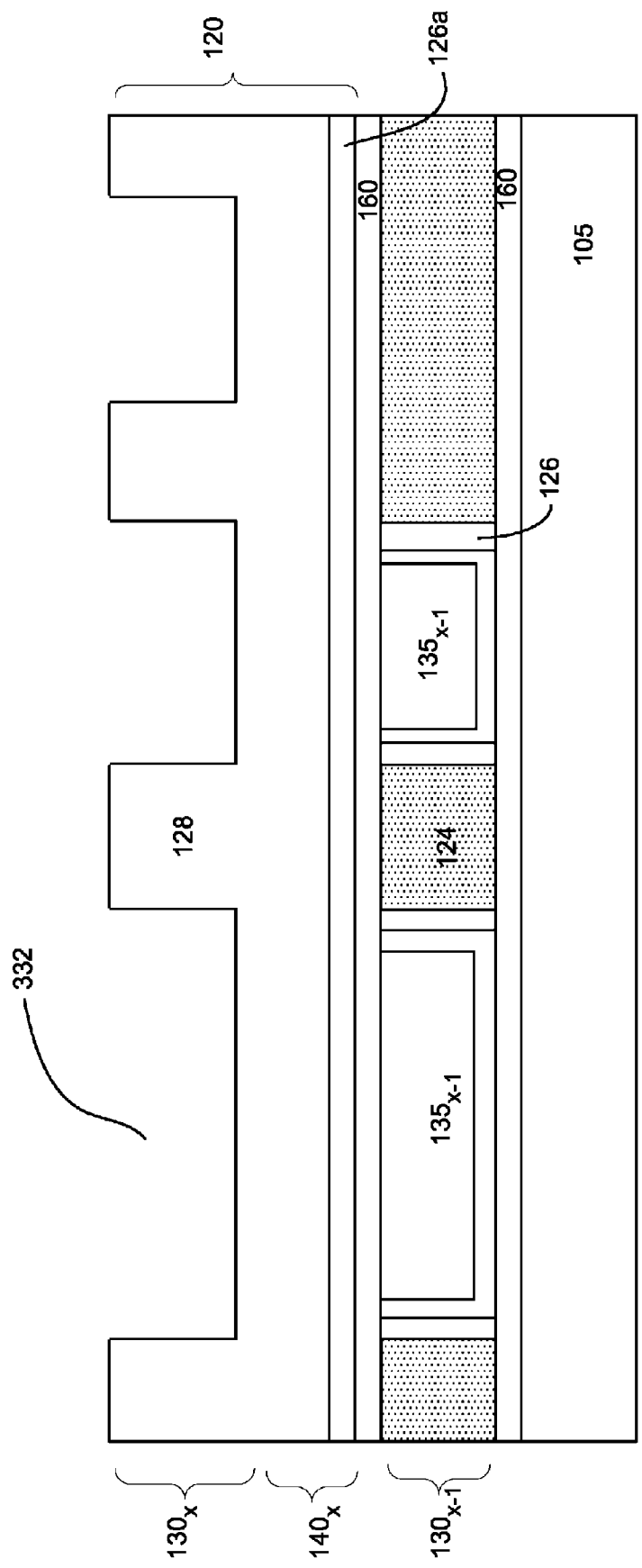

Referring to FIG. 4b, trenches 332 are formed in the third dielectric material in the trench level $130_x$. The trenches correspond to interconnects of metal level ($M_x$). In one embodiment, the trenches include wide and narrow trenches corresponding to wide and narrow interconnects. Other configurations of trenches may also be useful. A lower portion of the IMD layer includes a via level $140_{x-1}$. The trenches are formed by, for example, mask and etch techniques. For example, a soft mask, such as photoresist, is formed on the second dielectric material and patterned to form openings corresponding to the trenches. An ARC layer may be provided between the soft mask and third dielectric material to improve lithographic resolution. The trench level of the IMD layer is patterned to form the trenches by, for example, an anisotropic etch using the soft mask as an etch mask.

Figure 4C:
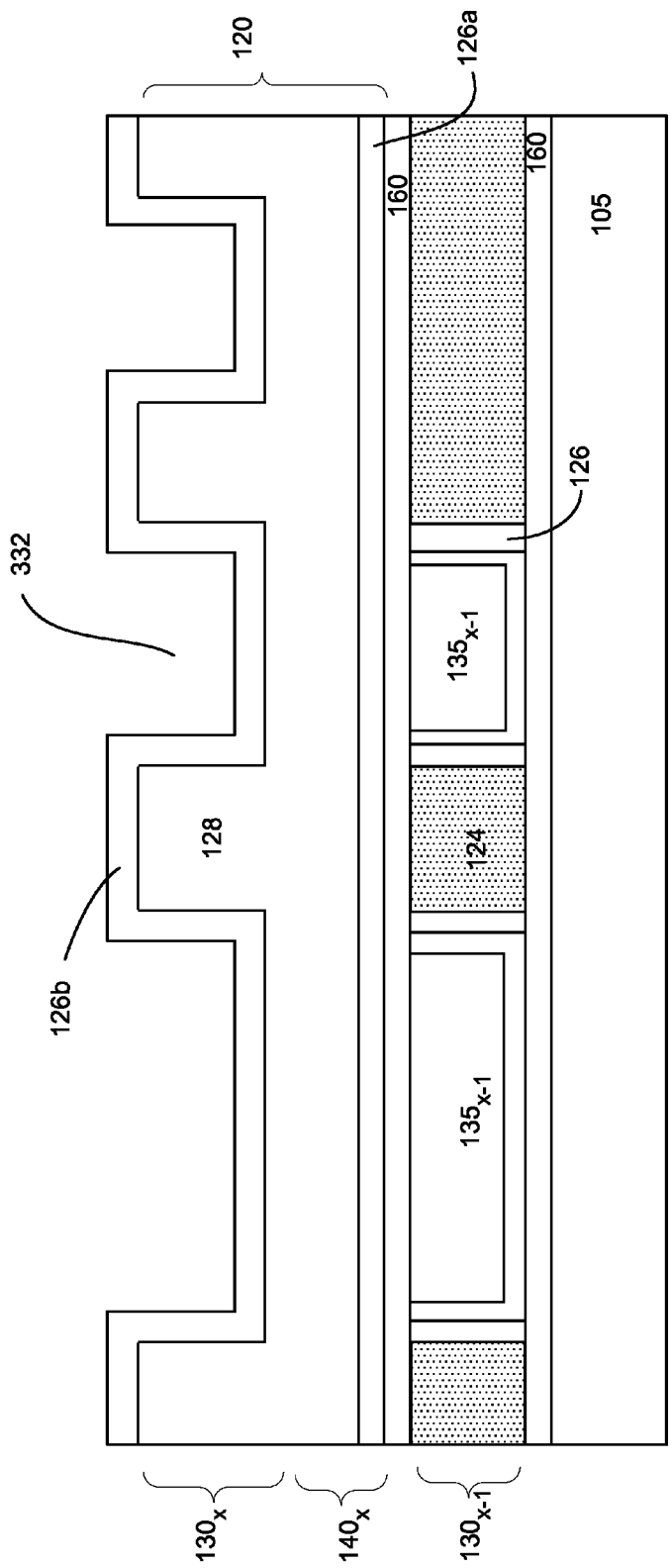

After forming the trenches, the soft mask is removed. The soft mask is removed by, for example, ashing. Other techniques for removing the soft mask are also useful. As shown in FIG. 4c, a second dielectric material 126b is formed on the substrate. The second dielectric material lines the top surface of the dielectric material and trenches. The second dielectric material may be formed by CVD or spin-on techniques. Other techniques for forming the second dielectric material are also useful.

Figure 4D:
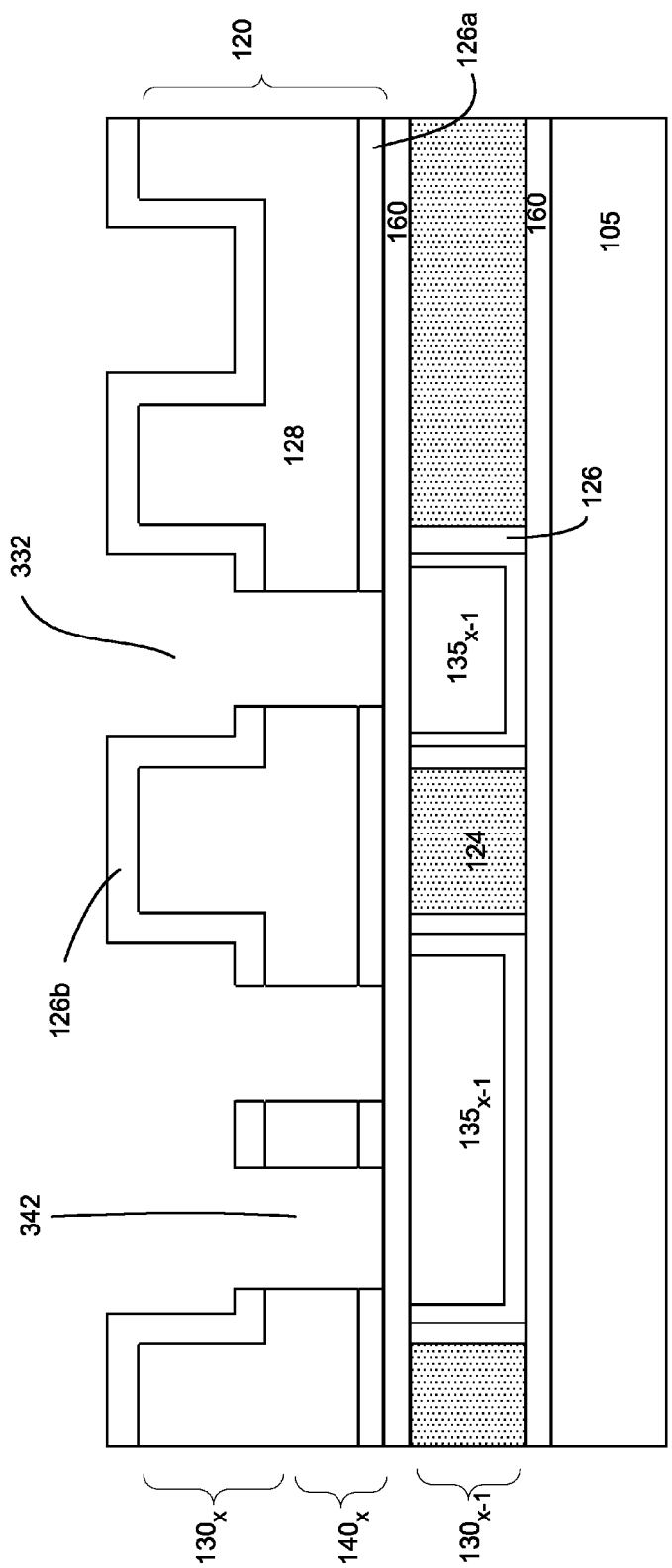

In FIG. 4d, vias 342 are formed in the partially processed IMD layer. The vias are formed through the second and third dielectric materials. A mask, such as a photoresist, may be employed to form the vias. An ARC layer may be provided between the mask and third dielectric material to improve lithographic resolution. The via level of the IMD layer is patterned to form the vias by, for example, an anisotropic etch using the soft mask as an etch mask. The etch, for example, stops on the lower etch stop layer. In one embodiment, the dual vias are formed in the wide trenches and single vias are formed in the narrow trenches. Other configurations of trenches and vias are also useful.

After forming the vias, the mask is removed. The mask is removed by, for example, ashing. Other techniques for removing the mask are also useful. In the case where the liner comprises the same material as the second dielectric material, as illustrated in FIG. 4f, the second dielectric material 126 lines or surrounds the third dielectric material.

The dual damascene openings, as described, are formed by a trench first dual damascene process. Other types of dual damascene processes may also be useful. Alternatively, the trenches and vias may be formed by single damascene processes, as already described. As shown, the dual damascene opening comprises vertical sidewalls. Providing openings with slanted sidewalls may also be useful. For example, the sidewalls can have an angle of about 85-89°. Other sidewall angles may also be useful.

An intermediate etch stop layer may be provided between the trench and via levels. This, for example, may be similar to the etch stop layer 160 disposed below the interconnect level $130_{x-1}$ of the lower IMD layer. The intermediate etch stop layer, for example, comprises SiC. Other types of etch stop material may also be useful. The intermediate etch stop layer may be employed to differentiate the trench and via levels. For example, the intermediate etch stop layer may facilitate forming the trenches and vias. In other embodiments, the intermediate etch stop layer may be omitted to further reduce the k value.

Figure 4E:
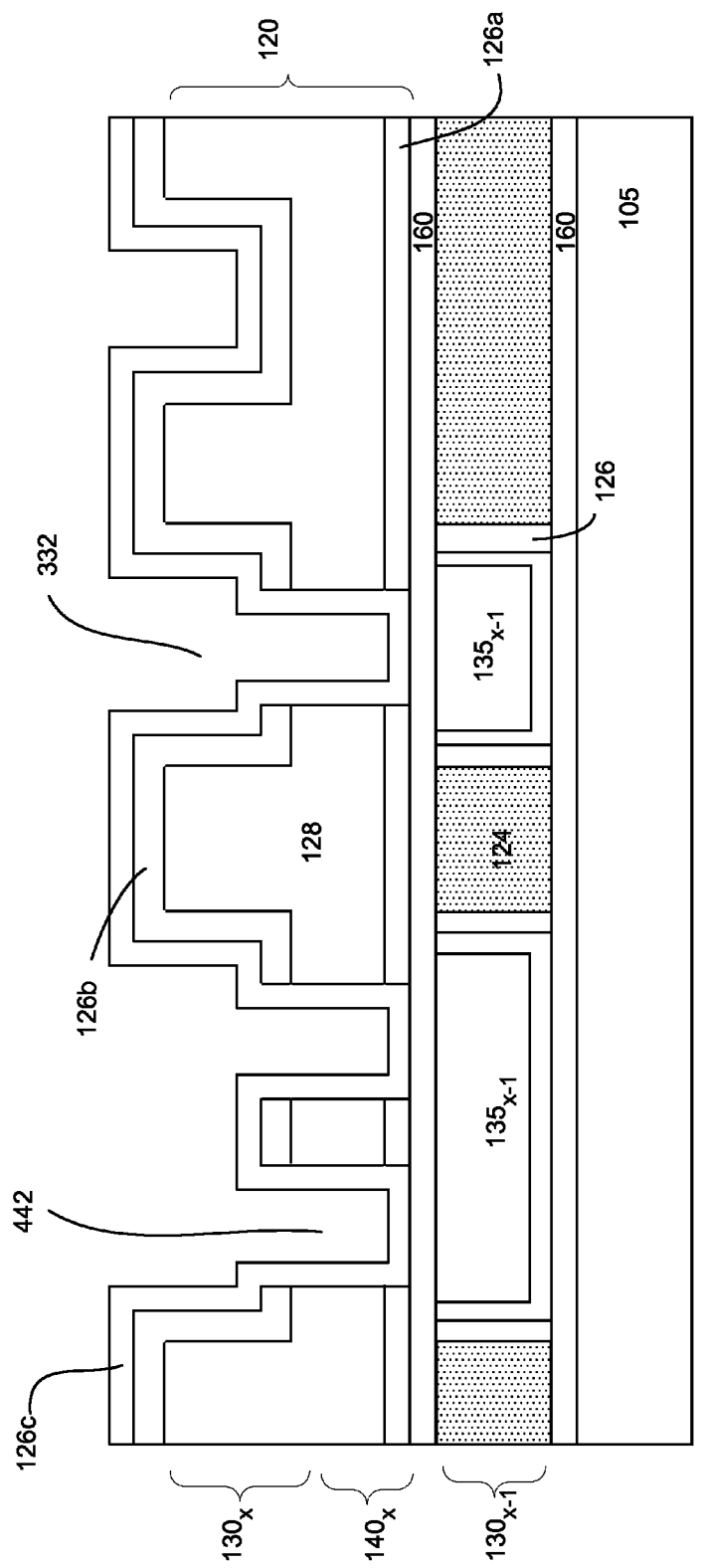
Figure 4F:
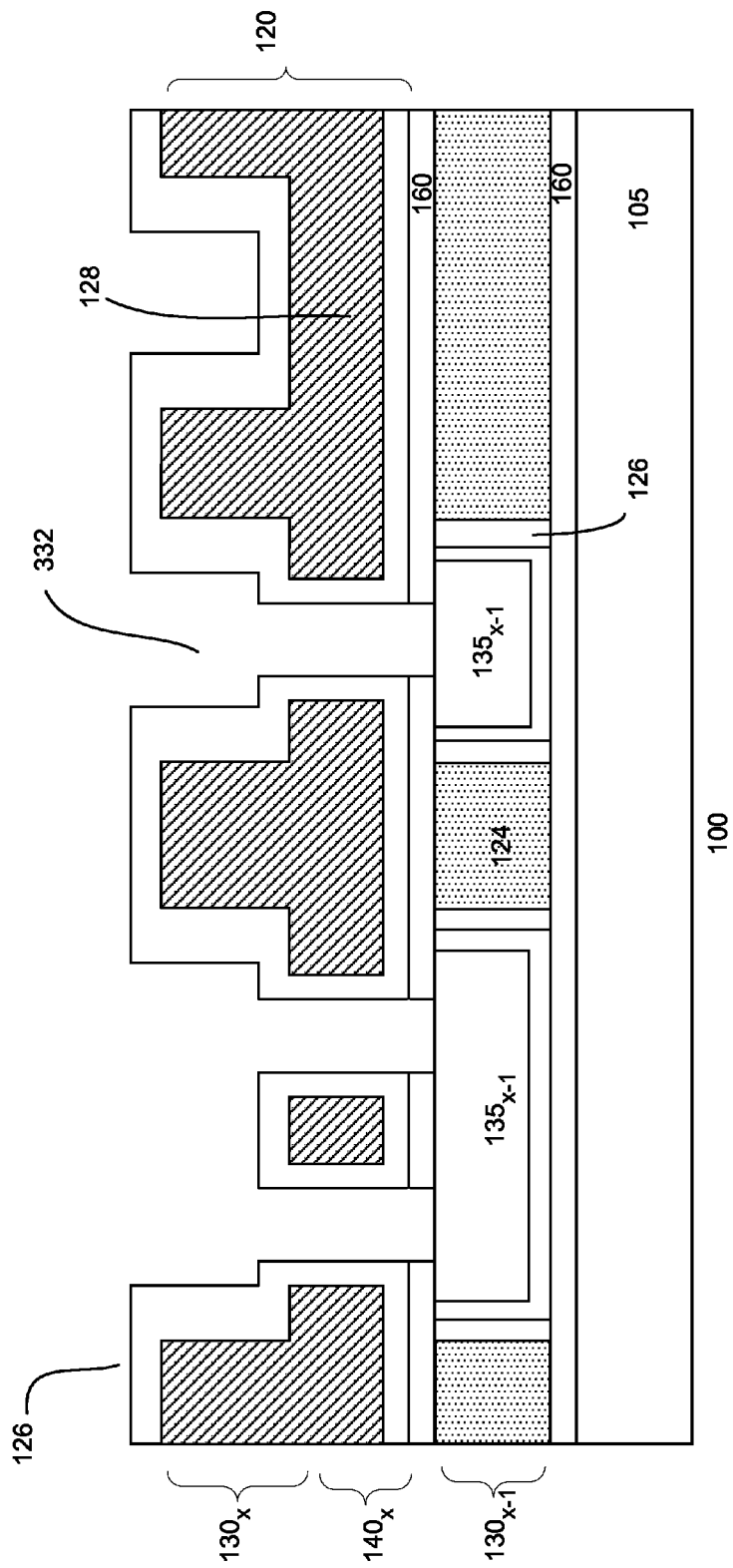

A liner 126c is formed on the substrate, as shown in FIG. 4e. The liner lines the surface of the second material, including in the trenches and vias. In the case where the via etch stops on the lower etch stop layer, the liner lines the top of the lower etch stop layer forming the bottom of the vias. In one embodiment, the liner comprises the second material. For example, the second material 126 surrounds the third material 128, as shown in FIG. 4f. Providing a liner with other types of dielectric materials may also be useful.

Figure 4G:
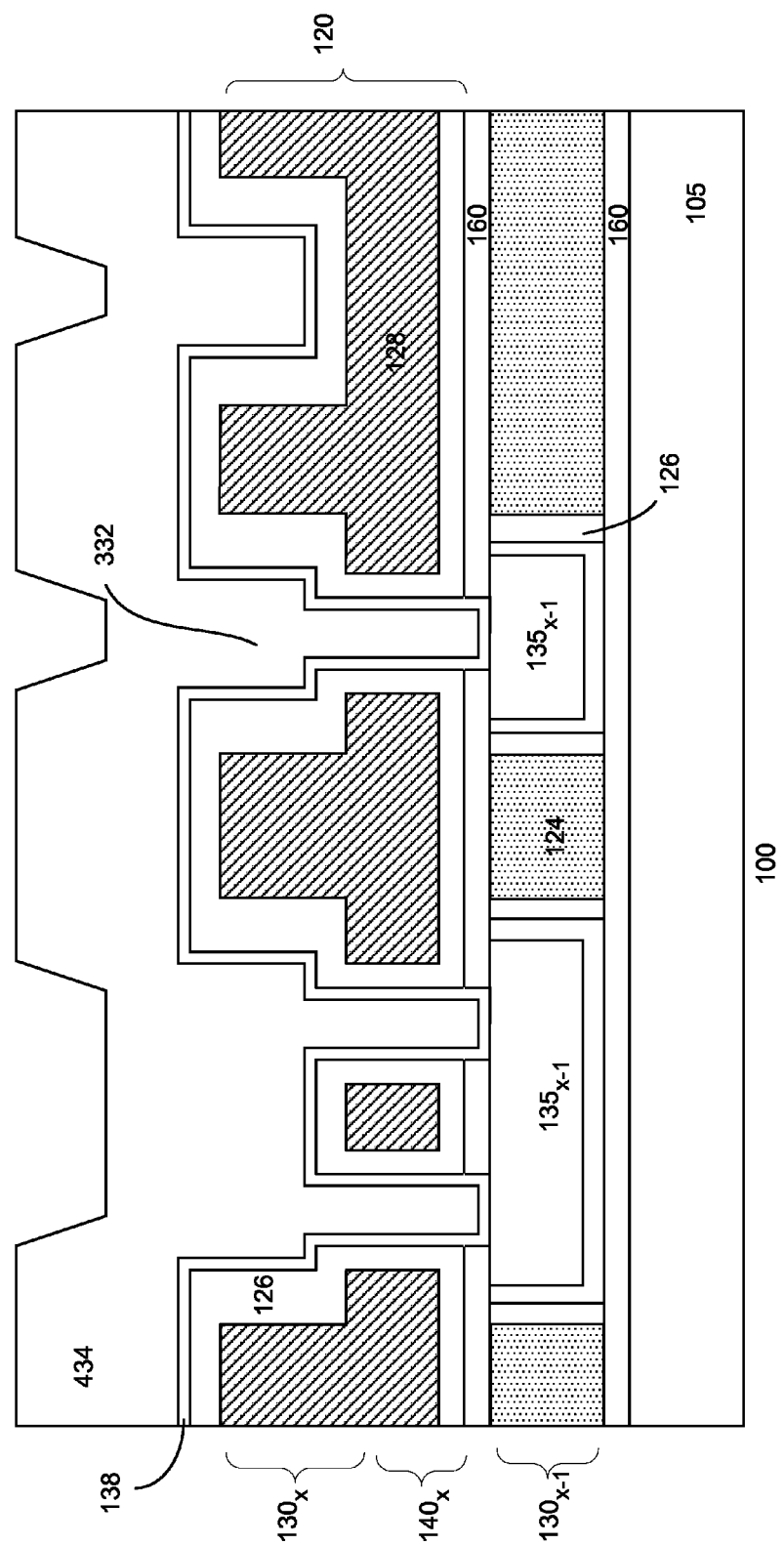

In FIG. 4g, a barrier layer 138 is deposited on the substrate, lining the second dielectric material, including the trenches and vias. The barrier layer, for example, can comprise TaN, Ta, TiN or a combination thereof. Other type of barrier material, such as ruthenium, is also useful. Providing a barrier layer having multiple layers is also useful. The barrier can be formed by, for example, PVD, CVD or atomic layer deposition (ALD). Other techniques for forming the barrier are also useful.

A conductive material 434 is deposited or formed on the substrate, covering the barrier and filling the trenches and vias. The conductive material, for example, comprises copper, aluminum, tungsten, alloys such as Al doped Cu, Mn doped Cu, or a combination thereof. Other types of conductive materials, including metals and alloys, are also useful. In one embodiment, the conductive material comprises copper. The conductive material can be deposited by electroplating. Other techniques, such as electro-less plating, CVD, PVD or sputtering, are also useful. The technique employed may depend on the material used.

Figure 4H:
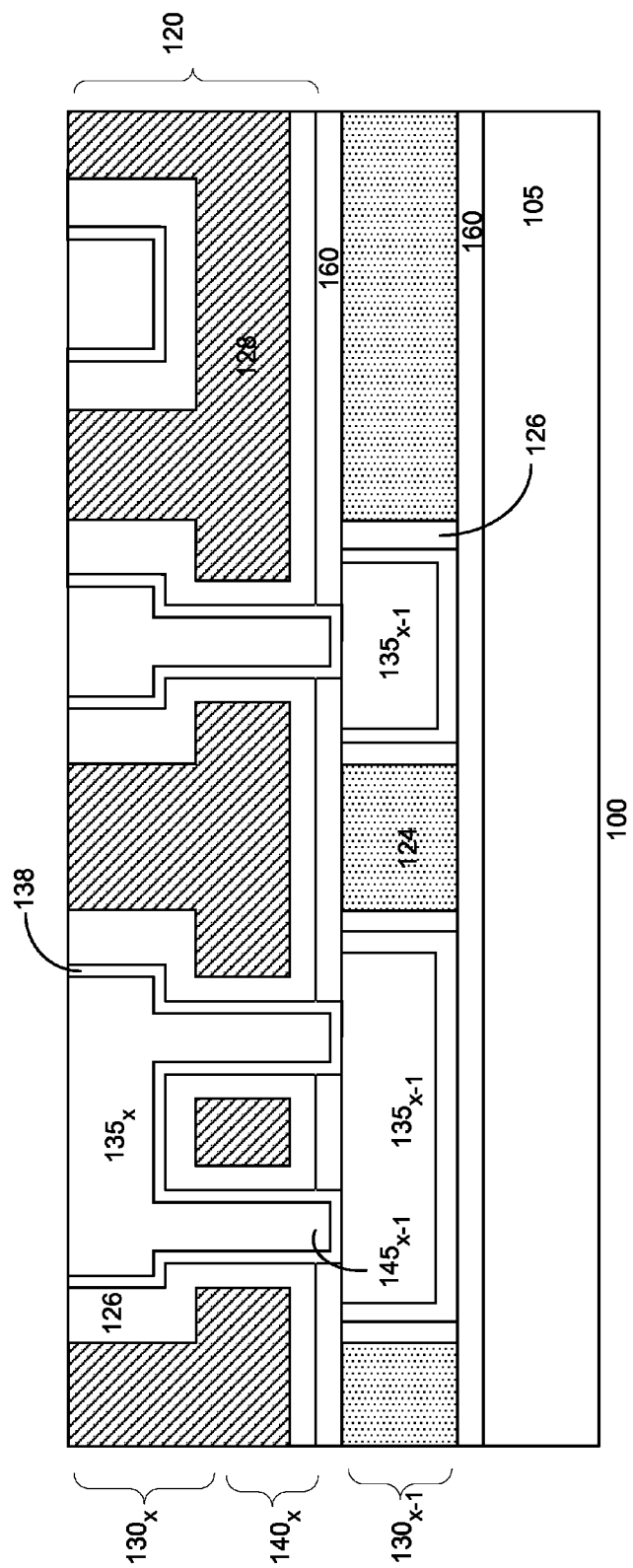

Referring to FIG. 4h, excess conductive material is removed to form interconnects 135$_x$ and vias 145$_{x-1}$. In one embodiment, the excess material is removed by a planarizing process. The planarizing process removes excess conductive material, liner layer and hard mask over the dielectric layer. This results in the top surface of the conductive material being planar with the top surface of the sacrificial layer. The planarizing process comprises, for example, a polishing process, such as chemical mechanical polishing (CMP), electro-CMP (eCMP) or a combination thereof. Other types of planarizing or polishing processes are also useful. The polishing process may include multiple polishing steps to remove the different materials, such as the conductive and barrier materials.

Figure 4I:
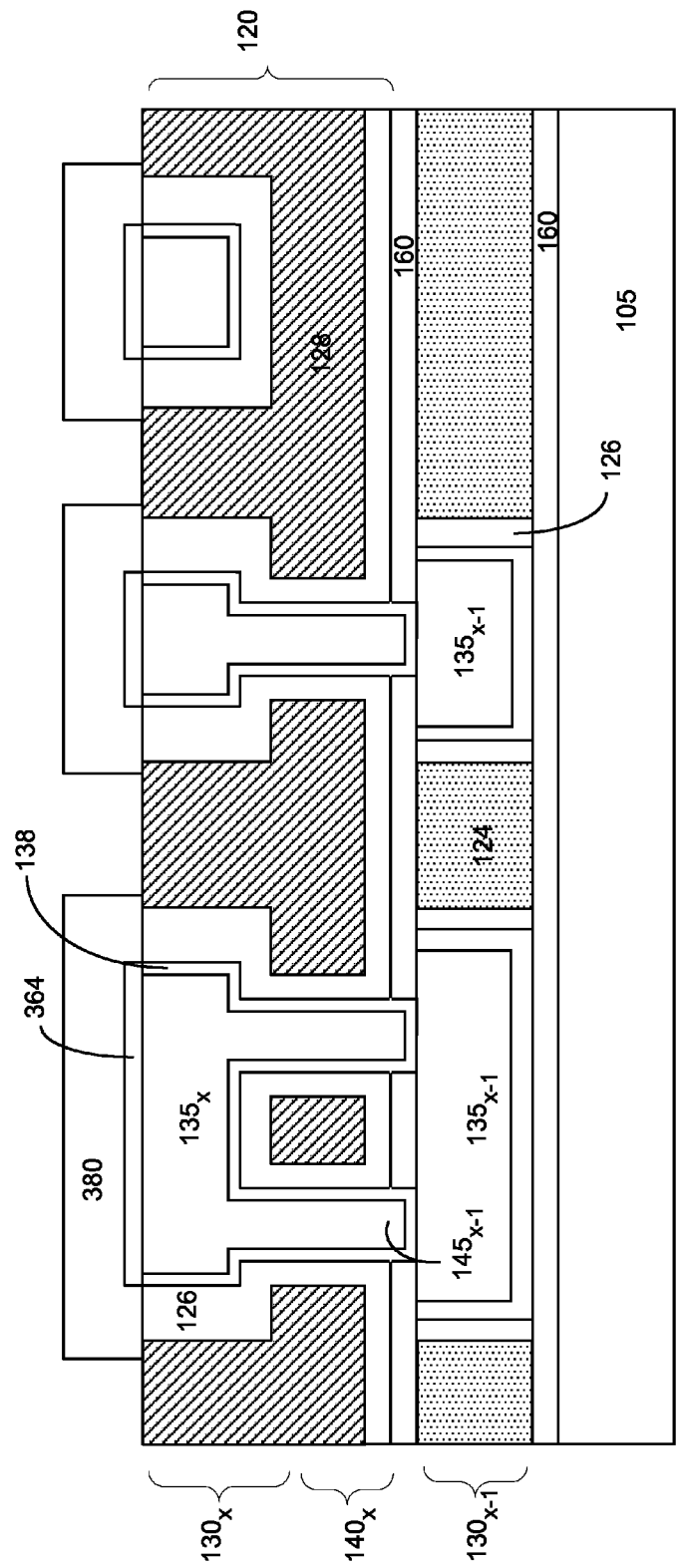

Referring to FIG. 4i, a passivation layer 364 is deposited on the substrate. The passivation layer covers the dielectric layer and the surface of the interconnects. In one embodiment, the passivation layer comprises a material for protecting the conductive material of the interconnects. For example, the passivation layer comprises CoWP or CuSiN. Other types of passivation layers are also useful. The passivation layer may be deposited by, for example, CVD. Other techniques for depositing the passivation layer are also useful.

In one embodiment, the passivation layer is patterned to selectively cover the interconnects. As shown, the passivation layer is patterned to selectively cover the interconnects and barrier layer. To pattern the passivation layer, mask and etch techniques can be employed. For example, a soft mask, such as photoresist, can be used. The photoresist, for example, can be formed by various techniques, such as spin-on. Other techniques are also useful. An anti-reflective coating (ARC) can be formed beneath the mask layer. The passivation layer may be self-aligned and may be subsequently removed from the dielectric layer.

The mask layer is selectively exposed and developed to create the desired pattern. In one embodiment, the mask comprises a pattern which protects the interconnects and barrier layer. Exposed portions of the passivation layer are removed by, for example, an anisotropic etch, such as RIE. Other techniques for patterning the dielectric are also useful. After the passivation layer is patterned, the mask is removed, leaving portions of the passivation layer covering the interconnects and barrier layer.

A soft mask layer 380 is formed and patterned. The patterned soft mask layer, in one embodiment, comprises a reverse mask for the non-interconnect area. In one embodiment, the reverse mask also covers about 20 nm of the non-interconnect area, leaving about 50 nm of the non-interconnect area exposed. As a result, the soft mask layer covers the interconnects as well as a small portion of the second dielectric layer.

Figure 4J:
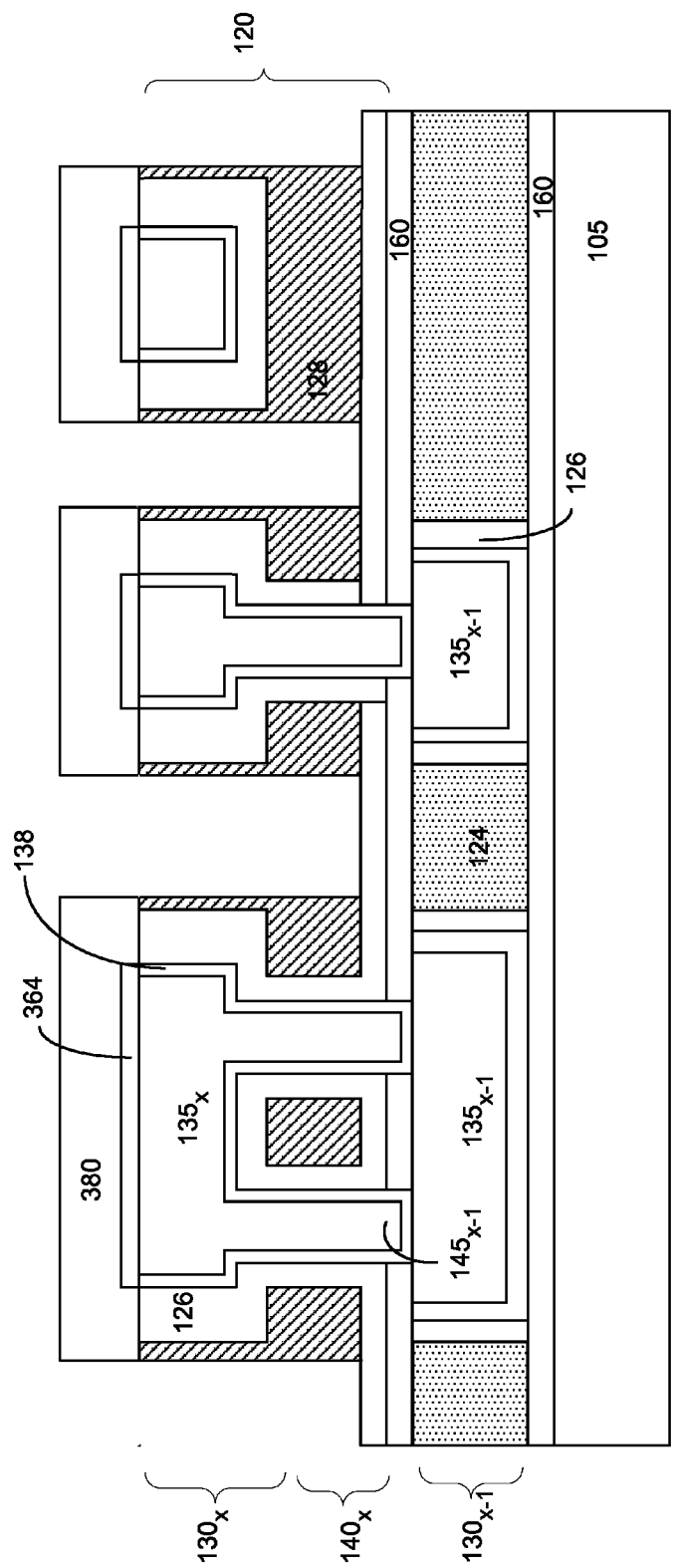

Referring to FIG. 4j, the exposed portions of the third dielectric material is etched. In one embodiment, the third dielectric layer is etched selectively to the second dielectric material. For example, the etch removes the third dielectric material, stopping on the second dielectric material. The etch may comprise a DHF dip that removes the third dielectric material completely. The soft mask layer is removed after etching the dielectric layer.

Figure 4K:
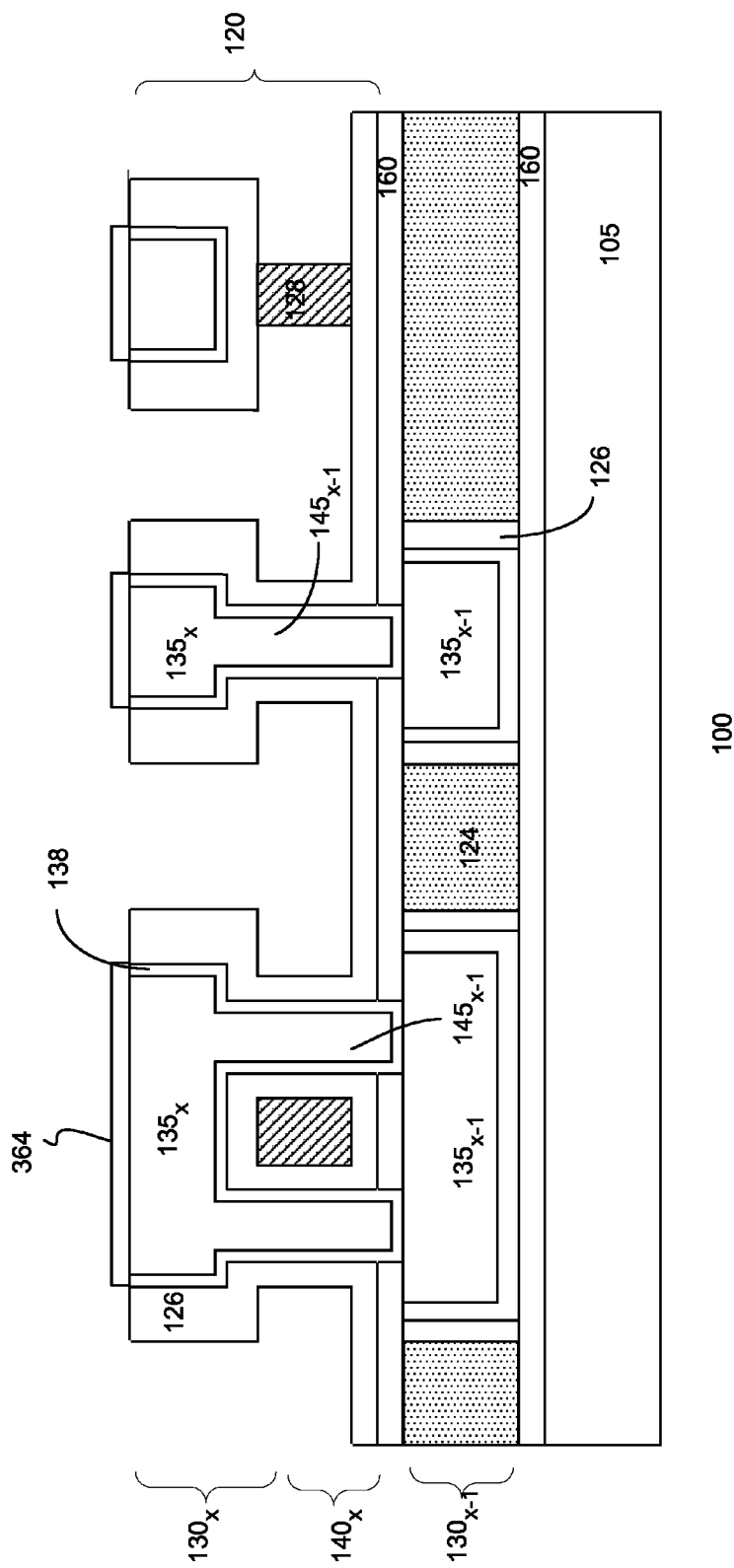
Figure 4I:
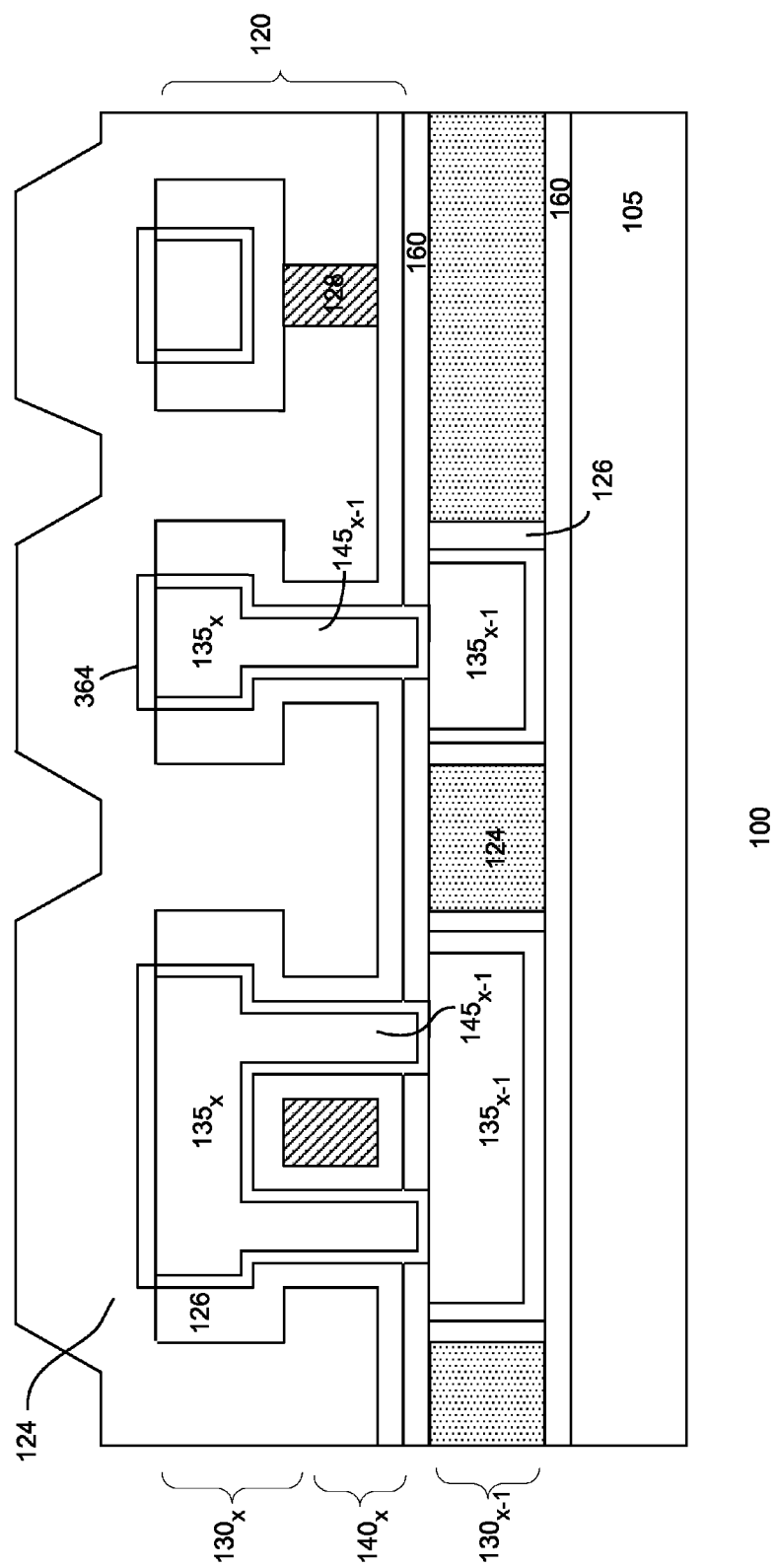

In FIG. 4k, a wet etch is performed to the third dielectric material adjacent to the trenches. The wet etch also removes portions of the third dielectric material below the trench. In one embodiment, the wet etch leaves a third dielectric material stud below the trenches and between the dual contacts. The stud may be about 10 nm or one seventh (⅐) of the width of the trench. In other embodiments, other widths may also be useful. The wet etch, for example, comprises a DHF dip. Other types of wet etches are also useful. The mask layer may not be removed until after the wet etch to protect the conductive interconnects.

A first dielectric material 124 having a first k value is deposited on the substrate, as shown in FIG. 4l. The first dielectric material fills the openings between the second and third dielectric materials. In one embodiment, the first k value is less than the second and third k values. In one embodiment, the first dielectric material comprises a ULK material. For example, the first dielectric material comprises pSiCOH.

In one embodiment, the first dielectric material is deposited by CVD. The CVD deposited first dielectric material completely fills the spaces between the second and third materials. As such, the second and third dielectric materials surround the sides and bottom of the first dielectric material.

Figure 4M:
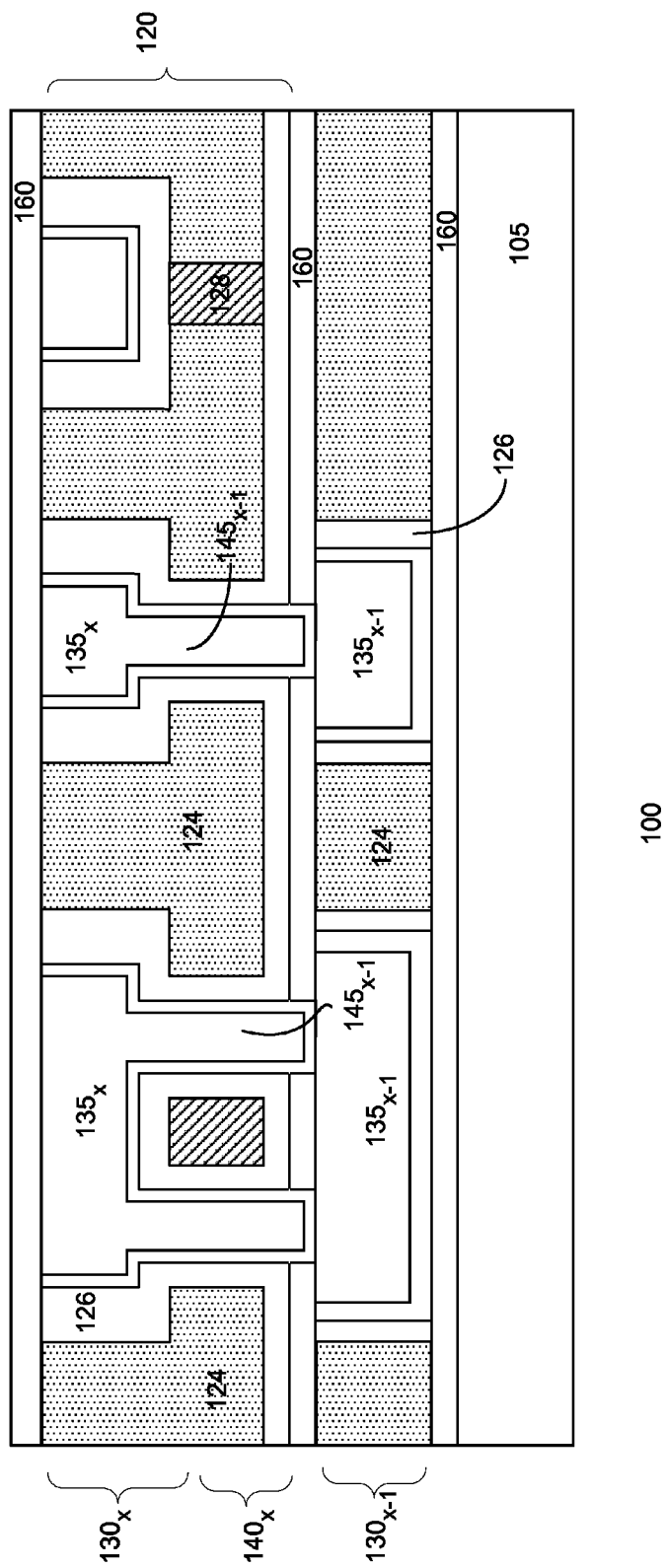

Referring to FIG. 4m, excess first dielectric material is removed by a planarizing process. The planarizing process, for example, comprises CMP or eCMP. In one embodiment, the planarizing process also removes the passivation layer over the interconnects, resulting in a hybrid IMD layer with top surfaces of the first dielectric material, the second dielectric material and the interconnects being coplanar.

An etch stop layer 160 is formed on the surface of the hybrid IMD layer. The etch stop layer, for example, serves as a capping layer of the IMD layer. In one embodiment, the etch stop layer comprises SiC. Other types of etch stop layer can also be formed on the top surface of the IMD layer. The etch stop layer, for example, can be formed by CVD or other deposition techniques.

The process continues to form the IC. For example, additional interconnect levels can be formed. The interconnect levels can be formed similar to the process described in FIGS. 4a-m. Further processing can include final passivation, dicing, assembly and packaging. Other processes are also useful.

Figure 5A:
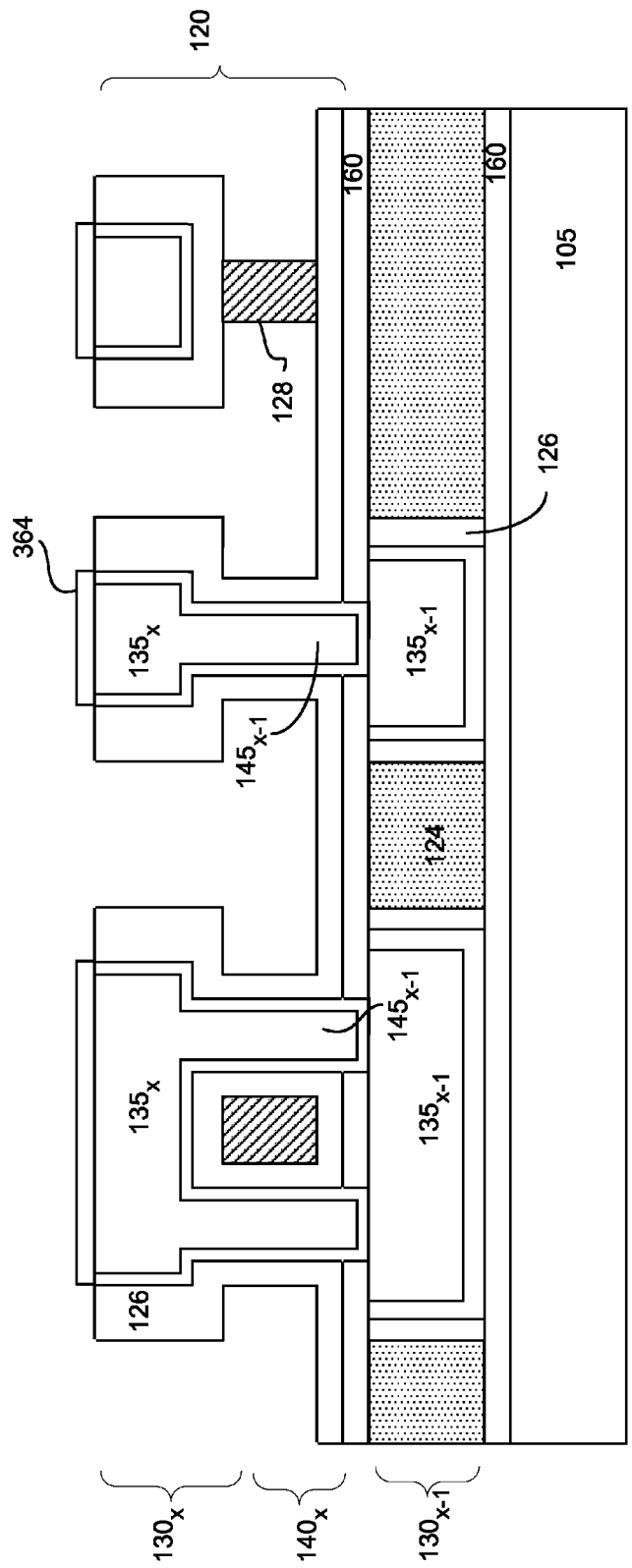
FIGS. 5a-c show another alternative embodiment of a process of forming a device.
Figure 5B:
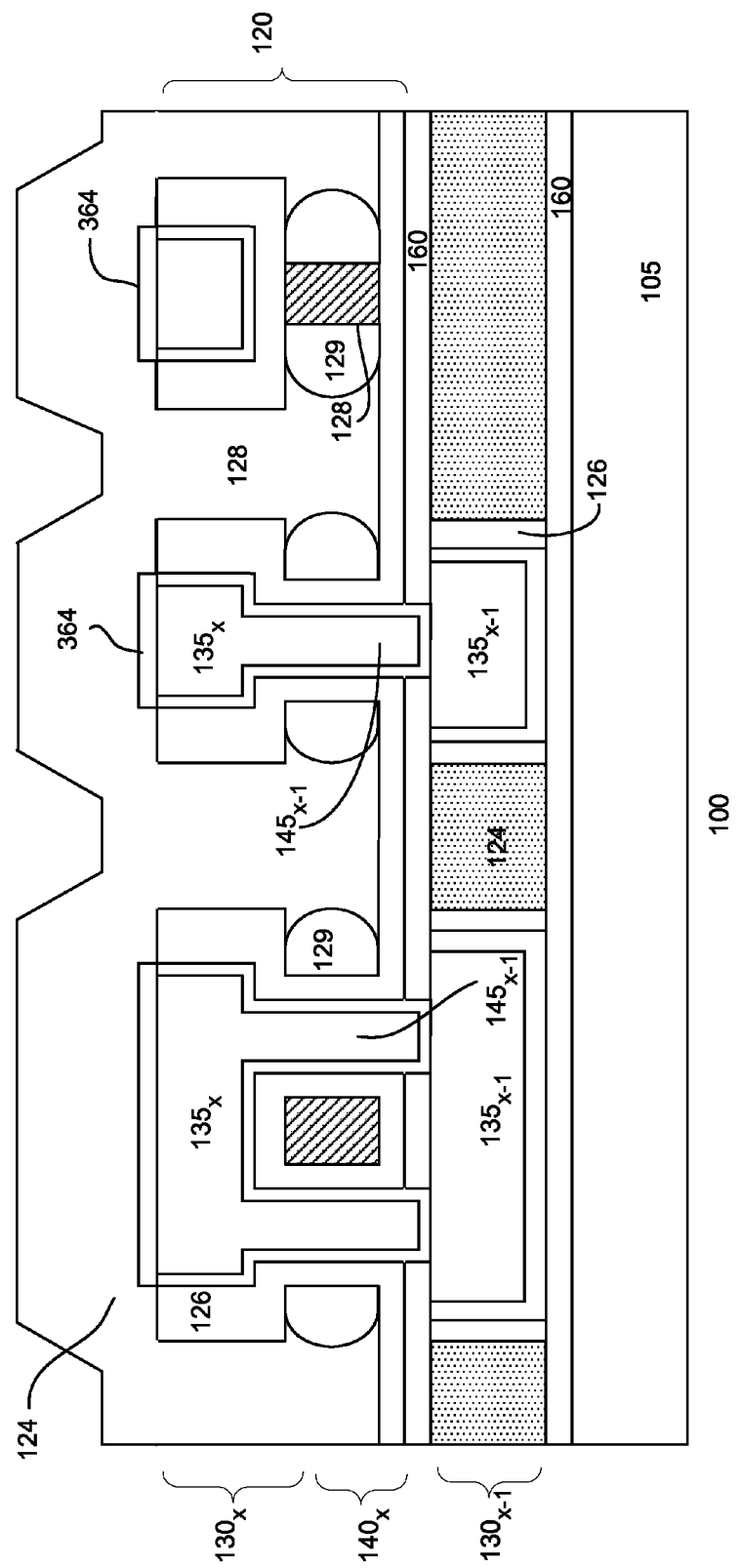
Figure 5C:
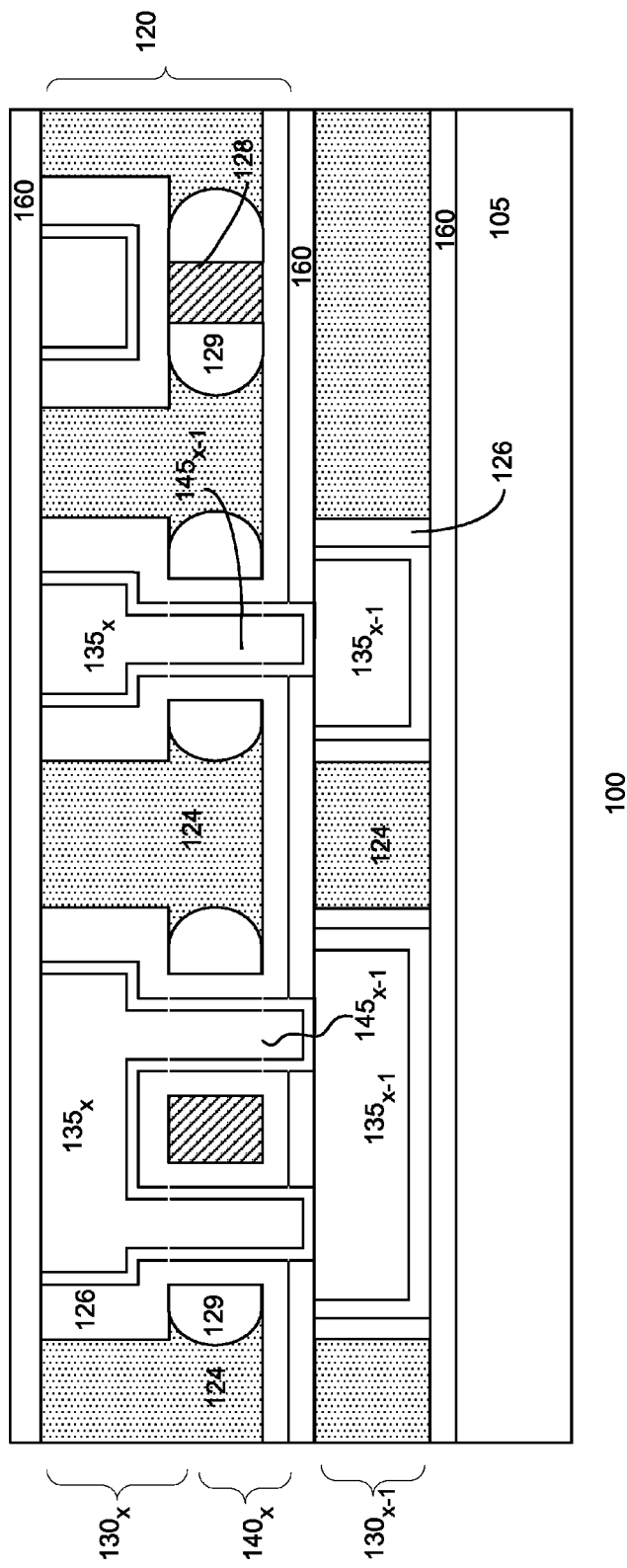

FIGS. 5a-c shows a process for forming another embodiment of a hybrid IMD layer 120 on a device 100. As shown in FIG. 5a, a partially processed hybrid IMD layer 120 is shown. The partially processed hybrid IMD layer is similar to that shown in FIG. 4k.

In FIG. 5b, a first dielectric material 124 having a first k value is deposited on the substrate, as shown in FIG. 4k. The first dielectric material fills the openings between the second and third dielectric materials. In one embodiment, the first k value is less than the second and third k values. In one embodiment, the first dielectric material comprises a ULK material. For example, the first dielectric material comprises pSiCOH.

In one embodiment, the first dielectric material is deposited by spin-on techniques. The spin-on deposited first dielectric material partially fills the spaces between the second and third materials. In one embodiment, air pockets 129 are formed beneath the trenches adjacent to the second and third materials as a result of depositing the first dielectric material. The air pockets, for example, create a fourth medium in the hybrid dielectric layer with the lowest k value.

Referring to FIG. 5c, excess first dielectric material is removed by a planarizing process. The planarizing process, for example, comprises CMP or eCMP. In one embodiment, the planarizing process also removes the passivation layer over the interconnects, resulting in a hybrid IMD layer with top surfaces of the first dielectric material, the second dielectric material and the interconnects being coplanar.

The process continues to form the IC. For example, additional interconnect levels can be formed. The interconnect levels can be formed similar to the process described in FIGS. 4a-m. Further processing can include final passivation, dicing, assembly and packaging. Other processes are also useful.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method of forming a device comprising:
providing a substrate prepared with a dielectric layer; and
processing the dielectric layer to serve as an intermetal dielectric (IMD) layer, wherein the IMD layer comprises a hybrid IMD layer comprising a plurality of dielectric materials with different k values, wherein processing the dielectric layer comprises
providing a second dielectric material having a second k value,
forming interconnects in the second dielectric material,
depositing a passivation layer covering the second dielectric material and surface of the interconnects after forming the interconnects,
patterning the passivation layer to cover only top surfaces of the interconnects,
providing a patterned soft mask layer covering the patterned passivation layer and in direct contact with a portion of the second dielectric material adjacent to the passivation layer and interconnects,
removing exposed portions of the second dielectric material not covered by the patterned soft mask layer to form openings,
providing a first dielectric material to fill the openings and between the interconnects, wherein the first dielectric material comprises a first k value which is lower than the second k value, and wherein the second dielectric material surrounds and contacts sides and bottom surface of the first dielectric material, and
processing the first and second dielectric materials such that top surfaces of the first dielectric material, the second dielectric material and the interconnects are coplanar with each other.

2. The method of claim 1 wherein the second dielectric material comprises a low k (LK) dielectric material and the first dielectric material comprises an ultra low k (ULK) dielectric material.

3. The method of claim 2 wherein the LK material comprises SiOCH and the ULK material comprises pSiCOH.

4. The method of claim 1 wherein:
the hybrid IMD layer comprises a third dielectric material with a third k value; and
the first dielectric material comprises the lowest k value, the second dielectric material comprises an intermediate k value, and the third dielectric material comprises a normal k value.

5. The method of claim 4 wherein the first dielectric material comprises an ULK material, the second dielectric material comprises a LK material, and the third dielectric material comprises a normal k (NK) material.

6. The method of claim 5 wherein the ULK material comprises pSiCOH, the LK material comprises SiOCH, and the NK material comprises SiO2 or FSG.

7. The method of claim 4 wherein the hybrid IMD layer comprises a fourth material having a different k value than the first, second and third dielectric materials.

8. The method of claim 1 wherein processing the first and second dielectric materials comprises removing excess first dielectric material by a planarization process, wherein the planarizing process also removes the passivation layer which covers only the top surfaces of the interconnects.

9. A method of forming a device comprising:
providing a substrate prepared with a dielectric layer; and
processing the dielectric layer to serve as an intermetal dielectric (IMD) layer, wherein the IMD layer comprises a hybrid IMD layer comprising a plurality of dielectric materials with different k values, the hybrid IMD layer comprises
a first dielectric material with a first k value,
a second dielectric material with a second k value,
a third dielectric material with third k value, and
a fourth material having a different k value than the first, second and third dielectric materials, and
interconnects disposed in the second dielectric material, wherein
the fourth material comprises the lowest k value among the first, second and third dielectric materials,
the second dielectric material surrounds sides and bottom of the first dielectric material, and
top surfaces of the first dielectric material, the second dielectric material and the interconnects are coplanar with each other.

10. The method of claim 9 wherein the fourth material comprises air.

11. A method of forming a device comprising:
providing a substrate prepared with a dielectric layer;
processing the dielectric layer to serve as an intermetal dielectric (IMD) layer, wherein the IMD layer comprises at least a trench in a trench level, a via in a via level, a first dielectric material having a first k value and a second dielectric material comprising a second k value, wherein
the second dielectric material lines sidewalls and a bottom of the trench in the trench level and sidewalls of the via in the via level and a bottom of the IMD layer, and
the IMD layer comprises a third dielectric material disposed below the trench between the second dielectric material lining the bottom of the trench and the bottom of the IMD layer, wherein the third dielectric material has the highest k value as compared with the first and second k values, and the width of the third dielectric material is 1/7 the width of the trench.

12. The method of claim 11 wherein the first dielectric material comprises an ultra low k (ULK) material and the second dielectric material comprises a low k (LK) material.

13. The method of claim 12 wherein the width of the LK material is 2/7 the width of the trench and the width of the ULK material is 5/7 the width of the trench.

14. The method of claim 11 wherein the IMD layer comprises a fourth material having a different k value than the first, second and third dielectric materials, the fourth material being disposed adjacent to the third dielectric material below the trench or the second dielectric material lining exposed sides of the via for reducing capacitance between parallel copper lines to reduce RC delay and improve circuit performance.

15. A method of forming a device comprising:
providing a substrate prepared with a dielectric layer; and
processing the dielectric layer to serve as an intermetal dielectric (IMD) layer, the IMD layer comprises at least a trench in a trench level and at least a via in a via level, wherein processing the dielectric layer comprises
  providing a second dielectric material having a second k value, wherein the second dielectric material lines sidewalls and a bottom of the trench in the trench level and sidewalls of the via in the via level and also lines a bottom of the IMD layer,
  providing a third dielectric material below the trench, wherein the third dielectric material is provided in between portions of the second dielectric material which line the bottom of the trench and the bottom of the IMD layer,
  forming interconnects in the second dielectric material,
  providing a first dielectric material between the interconnects
  after forming the interconnects, wherein the first dielectric material comprises a first k value which is lower than the second k value, the second dielectric material surrounds and contacts sides and bottom surface of the first dielectric material, and the third dielectric material has the highest k value as compared with the first and second k values, and
  processing the first and second dielectric materials such that top surfaces of the first dielectric material, the second dielectric material and the interconnects are coplanar with each other.

16. The method of claim 15 wherein processing the first and second dielectric materials comprises:
  depositing a passivation layer covering the second dielectric material and surface of the interconnects after forming the interconnects; and
  patterning the passivation layer to selectively cover the interconnects.

17. The method of claim 16 wherein the passivation layer comprises CoWP or CuSiN.

18. The method of claim 16 wherein processing the first and second dielectric materials comprises:
  providing a patterned soft mask layer covering the patterned passivation layer and a portion of the second dielectric material adjacent the passivation layer and interconnects; and
  removing exposed portions of the second dielectric material not covered by the patterned soft mask layer to form openings.

19. The method of claim 18 wherein forming the first dielectric material comprises filling the openings with the first dielectric material and removing excess first dielectric material by a planarization process.

20. The method of claim 15 wherein providing the first dielectric material also forms a fourth material which comprises air pockets adjacent to portions of the second dielectric material which line the bottom of the IMD layer.

21. The method of claim 15 wherein providing the first dielectric material also forms a fourth material adjacent to portions of the second dielectric material which line exposed sides of the via or directly adjacent to the third dielectric material which is disposed below the trench and in between the portions of the second dielectric material which line the bottom of the trench and the bottom of the IMD layer.

* * * * *